(12) United States Patent
Kanakasabapathy et al.

(10) Patent No.: US 8,779,515 B2
(45) Date of Patent: Jul. 15, 2014

(54) SEMICONDUCTOR STRUCTURE CONTAINING AN ALUMINUM-CONTAINING REPLACEMENT GATE ELECTRODE

(75) Inventors: Sivananda K. Kanakasabapathy, Niskayuna, NY (US); David V. Horak, Essex Junction, VT (US); Hemanth Jagannathan, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/476,364

(22) Filed: May 21, 2012

(65) Prior Publication Data
US 2013/0307033 A1 Nov. 21, 2013

(51) Int. Cl.
*H01L 27/12* (2006.01)
(52) U.S. Cl.
USPC .......................................... 257/351; 257/347
(58) Field of Classification Search
USPC ........... 257/351, 369, E27.112, E21.561, 347
See application file for complete search history.

(56) References Cited

U.S. PATENT DOCUMENTS

| 4,646,426 | A | 3/1987 | Sasaki | |
|---|---|---|---|---|
| 6,774,441 | B2 * | 8/2004 | Maki et al. | 257/384 |
| 6,887,747 | B2 * | 5/2005 | Yagishita et al. | 438/197 |
| 8,232,148 | B2 * | 7/2012 | Li et al. | 438/154 |
| 8,367,504 | B2 * | 2/2013 | Heinrich et al. | 438/281 |
| 2002/0045332 | A1 * | 4/2002 | Jang et al. | 438/585 |
| 2002/0055206 | A1 | 5/2002 | Zhang | |
| 2006/0110866 | A1 | 5/2006 | Gan et al. | |
| 2009/0194825 | A1 * | 8/2009 | Werner et al. | 257/397 |
| 2009/0289334 | A1 * | 11/2009 | Rachmady et al. | 257/649 |
| 2011/0156107 | A1 * | 6/2011 | Bohr et al. | 257/288 |
| 2011/0215409 | A1 * | 9/2011 | Li et al. | 257/351 |
| 2011/0281426 | A1 * | 11/2011 | Kim et al. | 438/586 |
| 2012/0119204 | A1 | 5/2012 | Wong et al. | |
| 2012/0119307 | A1 | 5/2012 | Li et al. | |
| 2012/0187420 | A1 * | 7/2012 | Li et al. | 257/77 |
| 2012/0187504 | A1 | 7/2012 | Igarashi | |

OTHER PUBLICATIONS

Vostrikov, A.A. et al., "Mechanism and Kinetics of Al2O3 Nanoparticles Formation by Reaction of Bulk Al with H2O and CO2 at Sub- and Supercritical Conditions" Journal of Supercritical Fluids (Nov. 2010) pp. 307-315, vol. 55, issue 1.
Meletis, E.I. et al., "Formation of Aluminum Nitride by Intensified Plasma Ion Nitriding" Journal of Vacuum Science & Technology A (Jul. 1991) pp. 2279-2284, vol. 9, issue 4.
United States Office Action dated Mar. 21, 2014 recieved in related case U.S. Appl. No. 13/771,930.

* cited by examiner

*Primary Examiner* — Bilkis Jahan
(74) *Attorney, Agent, or Firm* — Scully, Scott, Murphy & Presser, P.C.; H. Daniel Schnurmann

(57) ABSTRACT

An aluminum-containing material is employed to form replacement gate electrodes. A contact-level dielectric material layer is formed above a planarization dielectric layer in which the replacement gate electrodes are embedded. At least one contact via cavity is formed through the contact-level dielectric layer. Any portion of the replacement gate electrodes that is physically exposed at a bottom of the at least one contact via cavity is vertically recessed. Physically exposed portions of the aluminum-containing material within the replacement gate electrodes are oxidized to form dielectric aluminum compound portions. Subsequently, each of the at least one active via cavity is further extended to an underlying active region, which can be a source region or a drain region. A contact via structure formed within each of the at least one active via cavity can be electrically isolated from the replacement gate electrodes by the dielectric aluminum compound portions.

10 Claims, 21 Drawing Sheets

SEMICONDUCTOR STRUCTURE CONTAINING AN ALUMINUM-CONTAINING REPLACEMENT GATE ELECTRODE

BACKGROUND

The present disclosure relates to semiconductor structures, and particularly to a semiconductor structure including a borderless contact for an aluminum-containing gate, and methods of manufacturing the same.

As semiconductor devices shrink in each generation of semiconductor technology, formation of contact structures to source and drain regions of a field effect transistor become challenging. Such contact structures not only need to provide reliable electrical contact to active regions, such as source and drain regions, but also need to avoid electrically shorting to other components such as the gate electrode of the field effect transistor. Since the etch chemistry employed for the anisotropic etch process remains the same while the lateral dimension of the dielectric spacer shrinks with the scaling of semiconductor devices, the likelihood of overlay variations during lithographic processes causing formation of contact structures that electrically short an active region to a gate conductor of a field effect transistor increases in each generation.

Nonetheless, contact structures to source and drain regions must avoid electrically shorting to gate conductors to provide a functional field effect transistor. Thus, the possibility of electrically shorting source/drain regions to a gate conductor of a field effect transistor is a significant concern for product yield and reliability purposes.

BRIEF SUMMARY

An aluminum-containing material is employed to form replacement gate electrodes. A contact-level dielectric material layer is formed above a planarization dielectric layer in which the replacement gate electrodes are embedded. At least one contact via cavity is formed through the contact-level dielectric layer. Any portion of the replacement gate electrodes that is physically exposed at a bottom of the at least one contact via cavity is vertically recessed. Physically exposed portions of the aluminum-containing material within the replacement gate electrodes are oxidized to form dielectric aluminum compound portions. Subsequently, each of the at least one active via cavity is further extended to an underlying active region, which can be a source region or a drain region. A contact via structure formed within each of the at least one active via cavity can be electrically isolated from the replacement gate electrodes by the dielectric aluminum compound portions.

According to another aspect of the present disclosure a semiconductor structure is provided, which includes: a semiconductor device located on a semiconductor substrate, the semiconductor device including an aluminum-containing material portion; a contact level dielectric layer located over a topmost surface of the aluminum-containing material portion; a contact via structure extending through the contact level dielectric layer and in contact with a conductive material portion of the semiconductor device; and a dielectric aluminum compound portion in contact with the aluminum-containing material portion and the contact via structure.

According to another aspect of the present disclosure, a method of forming a semiconductor structure is provided, which includes: forming a semiconductor device including an aluminum-containing material portion on a semiconductor substrate; forming a contact level dielectric layer over a topmost surface of the aluminum-containing material portion; forming a contact via cavity by etching through the contact level dielectric layer and into a sub-portion of the aluminum-containing material portion; and converting a surface portion of the aluminum-containing material portion into a dielectric aluminum compound portion.

DETAILED DESCRIPTION

Figure 1:
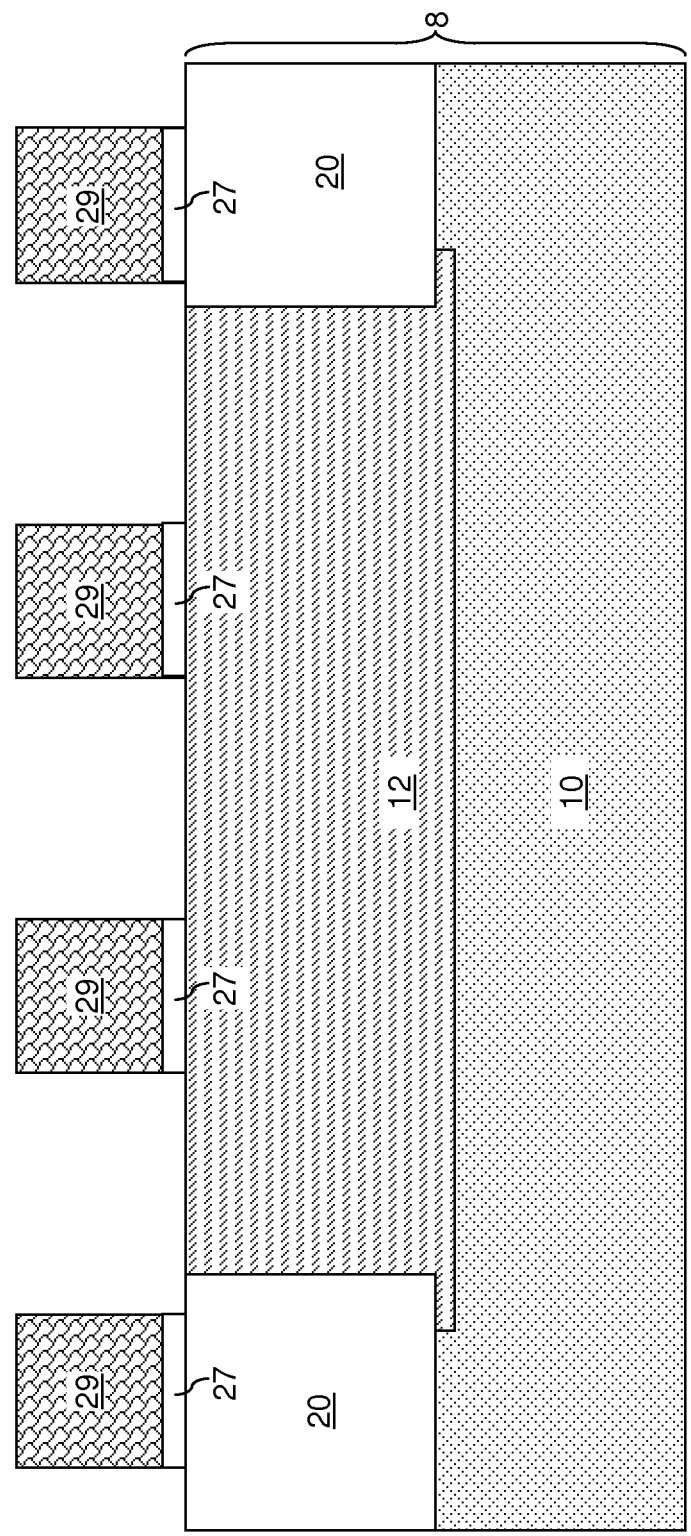
FIG. 1 is vertical cross-sectional view of a first exemplary semiconductor structure after formation of disposable gate structures according to a first embodiment of the present disclosure.

As stated above, the present disclosure, which relates to a semiconductor structure including a borderless contact for an aluminum-containing gate, and methods of manufacturing the same, which are now be described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to a first embodiment of the present disclosure includes a semiconductor substrate 8, on which various components of at least one semiconductor device can be subsequently formed. The at least one semiconductor device can include, for example, a field effect transistor. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of p-type or n-type at different dopant concentration levels. For example, the semiconductor substrate 8 may include an underlying semiconductor layer 10 and a doped well 12. The conductivity type of the doped well 12 can be the same as, or different from, the conductivity type of the underlying semiconductor layer 10.

Shallow trench isolation structures 20 can be formed to laterally separate the doped well 12 from any other doped well (not shown). The shallow trench isolation structures 20 include a dielectric material such as silicon oxide, silicon nitride, and/or silicon nitride, and can laterally surround an upper portion of the doped well 12.

A disposable dielectric layer and a disposable gate material layer are deposited and lithographically patterned to form disposable gate structures. For example, each disposable gate structure can include a stack of a disposable dielectric portion 27 and a disposable gate material portion 29. The disposable dielectric layer can include a dielectric material such as a semiconductor oxide. The disposable gate material layer can include a material that can be subsequently removed selective to dielectric material of the disposable dielectric layer. In one embodiment, the disposable gate material layer can include a semiconductor material. Optionally, each disposable gate structure can further include a gate cap dielectric portion (not shown) including a dielectric material such a silicon oxide or silicon nitride.

Figure 2:
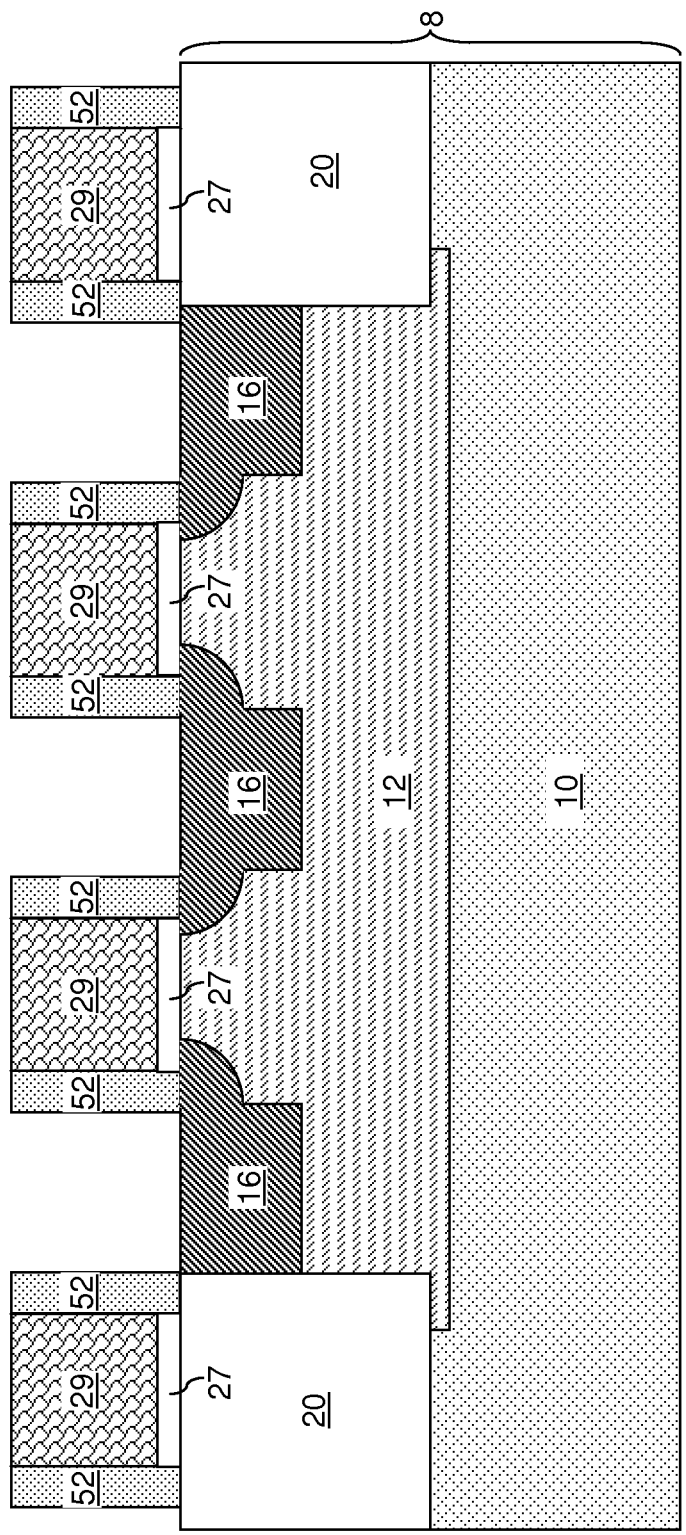
FIG. 2 is a vertical cross-sectional view of the first exemplary semiconductor structure after formation of dielectric spacers and active regions according to the first embodiment of the present disclosure.

Referring to FIG. 2, dielectric spacers 52 are formed on sidewalls of each of the disposable gate structures, for example, by deposition of a conformal dielectric material layer and an anisotropic etch that removes horizontal portions of the conformal dielectric material layer. Each dielectric spacer 52 laterally surrounds a disposable gate structure (27, 29). If the at least one semiconductor device to be formed employs a gate electrode to be subsequently formed by replacing the materials of the disposable gate structures (27, 29), the dielectric spacers 52 can be gate spacers that laterally surround the gate electrodes upon formation of the gate electrodes. The dielectric spacers 52 can include silicon nitride, silicon oxide, or silicon oxynitride.

Further, electrical dopants are implanted into regions of the doped well 12 before and/or after formation of the dielectric spacers 52 to form doped active regions 16, which can include source regions and drain regions. As used herein, an "active region" refers to a semiconductor material region located within or directly on the semiconductor substrate 8 and constituting an element of a semiconductor device. An active region can be a source region, a drain region, a body region, or any semiconductor component region of a semiconductor device. The disposable gate structures (27, 29) are employed as an implantation mask if the implantation is performed prior to formation of the dielectric spacers 52. A combination of the he disposable gate structures (27, 29) and the dielectric spacers 52 is employed as an implantation mask if the implantation is performed after formation of the dielectric spacers 52.

Figure 3:
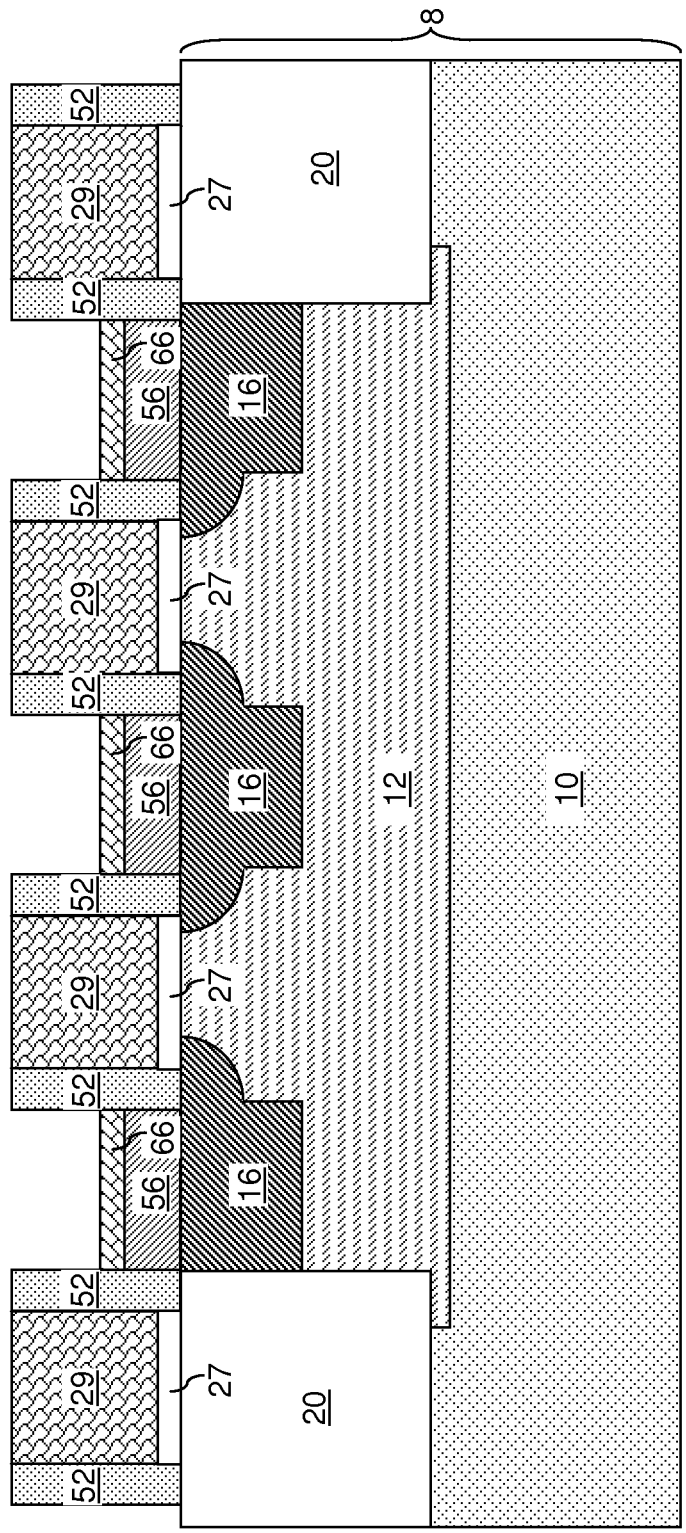
FIG. 3 is a vertical cross-sectional view of the first exemplary semiconductor structure after formation of raised active regions and metal semiconductor alloy portions according to the first embodiment of the present disclosure.

Referring to FIG. 3, raised active regions 56 can be optionally formed, for example, by selective epitaxy of a doped semiconductor material having a same type of doping as the doped active regions 16. The raised active regions 56 are located on and/or above the topmost surface of the semiconductor substrate 8. In one embodiment, the raised active regions 56 can include raised source regions and/or raised drain regions. In one embodiment, any semiconductor surface on the topmost portion of the disposable gate material portions 29, if present, can be converted to a thin layer of a dielectric material such as a semiconductor oxide, a semiconductor nitride, or a semiconductor oxynitride by thermal or plasma conversion to avoid deposition of a semiconductor material on the top surface of the disposable gate material portions 29. Each raised active region 56 is a conductive material portion.

Optionally, metal semiconductor alloy portions 66 can be formed on the raised active regions 56, for example, by depositing a metal on the top surface of the raised active regions 56 and reacting the metal with the semiconductor material of the raised active regions 56. Unreacted portions of the metal are removed selective to the metal semiconductor alloy portions 66. In one embodiment, the metal semiconductor alloy portions 66 can be formed on a raised source region, a raised drain region, a planar source region that is formed as one of the doped active regions 16 (in case the formation of the raised active regions 56 is omitted), or a planar drain region that is formed as one of the doped active regions 16 (in case the formation of the raised active regions 56 is omitted). In this case, the metal semiconductor alloy portions 66 can include a source-side metal semiconductor alloy portion and/or a drain-side metal semiconductor alloy portion. In one embodiment, the metal semiconductor alloy portions 66 can include a metal silicide, a metal germanide, or a metal germanosilicide.

Figure 4:
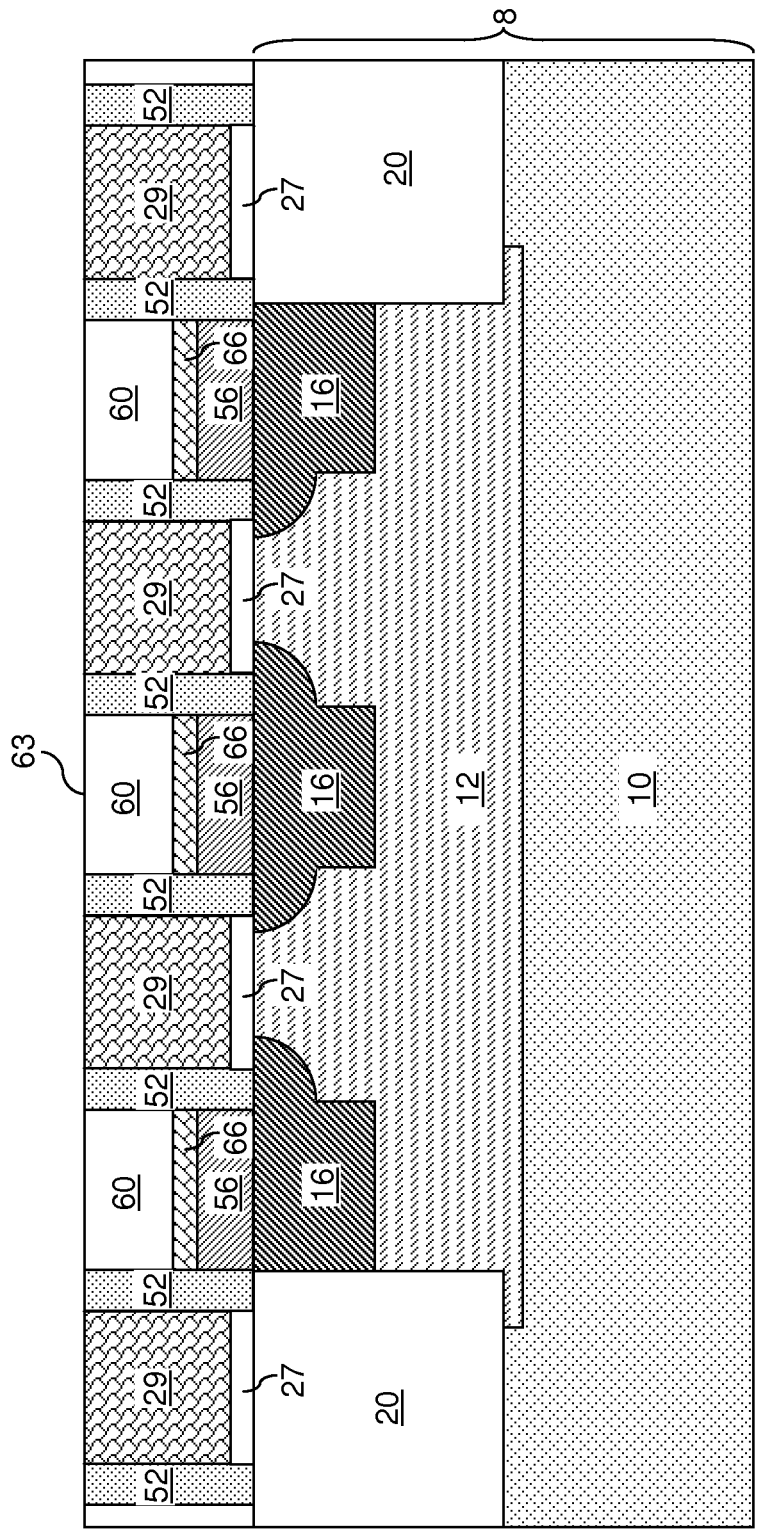
FIG. 4 is a vertical cross-sectional view of the first exemplary semiconductor structure after deposition and planarization of a planarization dielectric layer according to the first embodiment of the present disclosure.

Referring to FIG. 4, a planarization dielectric layer 60 is deposited over the disposable gate structures (27, 29), dielectric spacers 52, the semiconductor substrate 8, and any raised active regions 56 and metal semiconductor alloy portions 66. The planarization dielectric layer 60 can be formed by depositing a dielectric material, which can be selected from undoped silicate glass (USG), a doped silicate glass, an organosilicate glass (OSG), undoped silicon oxynitride, and a doped silicon oxynitride. In one embodiment, the planarization dielectric layer 60 is a dielectric material that may be easily planarized. For example, the planarization dielectric layer 60 can be a doped silicate glass or an undoped silicate glass (silicon oxide). In one embodiment, the planarization dielectric layer 60 can include a dielectric material that is different from the dielectric material of the dielectric spacers 52. For example, if the dielectric spacers 52 include silicon nitride, silicon oxide, or silicon oxynitride, the planarization dielectric layer 60 can include an OSG. If the dielectric spacers 52 include silicon nitride, the planarization dielectric layer 60 can include silicon oxide or an OSG.

The planarization dielectric layer 60 is planarized above the topmost surfaces of the disposable gate structures (27, 29), i.e., above the topmost surfaces of the disposable gate material portions 29. Any gate cap dielectric portion or any dielectric material converted from a semiconductor material prior to selective epitaxy of the raised active regions 56, if any, can be removed during the planarization. The planarization can be performed, for example, by chemical mechanical planarization (CMP). The planar topmost surface of the planarization dielectric layer 60 is herein referred to as a planar dielectric surface 63. The top surfaces of the dielectric spacers 52 and the top surfaces of the disposable gate material portions 29 can be coplanar with the planar dielectric surface 63.

Figure 5:
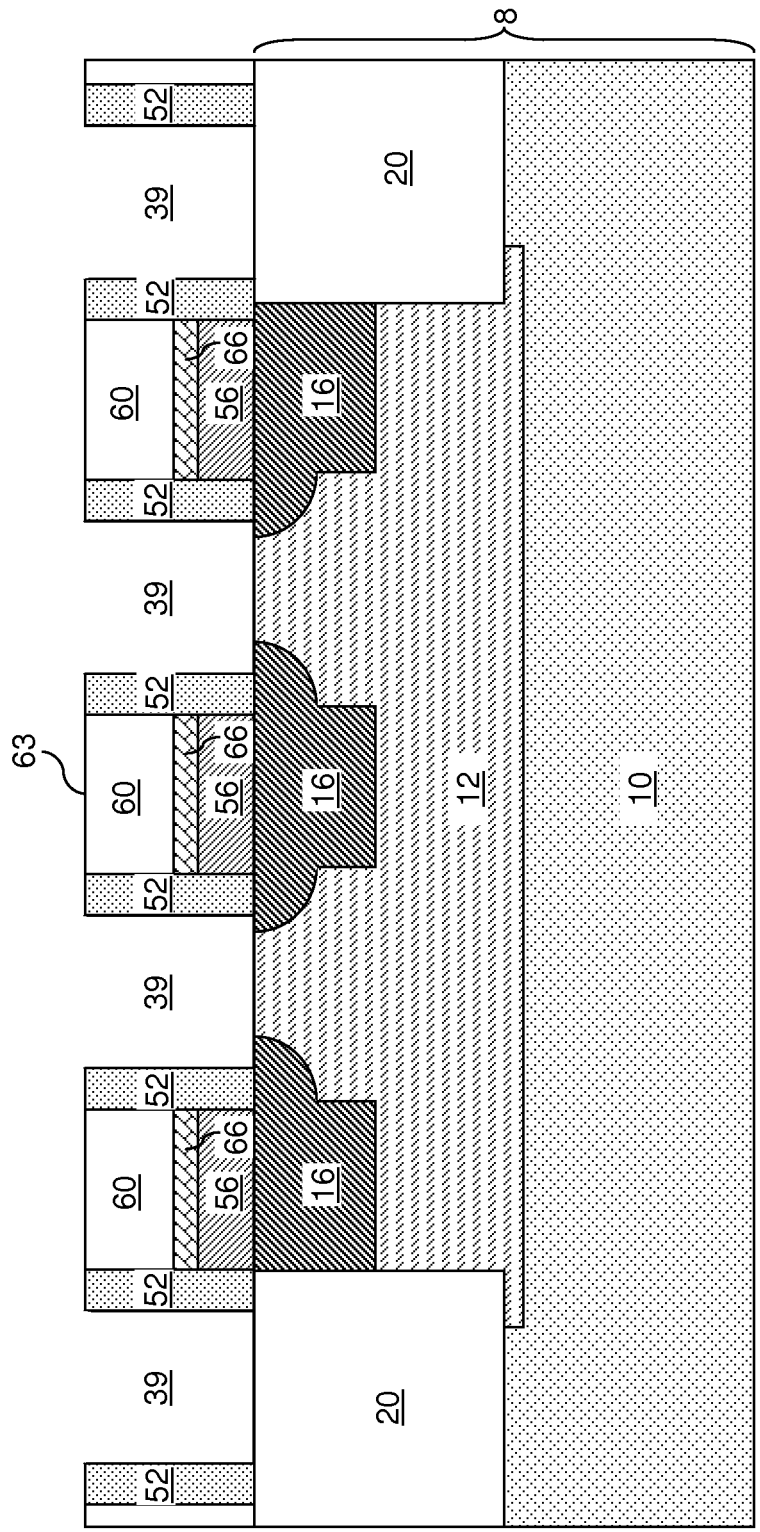
FIG. 5 is a vertical cross-sectional view of the first exemplary semiconductor structure after removal of the disposable gate structures according to the first embodiment of the present disclosure.

Referring to FIG. 5, the disposable gate structures (27, 29) are removed by at least one etch. The at least one etch can be a recess etch, which can be an isotropic etch or anisotropic etch. The etch employed to remove the disposable gate material portions 29 is preferably selective to the dielectric materials of the planarization dielectric layer 60 and the dielectric spacers 52. Subsequently, disposable dielectric portions 27 are removed selective to the semiconductor material of the doped well 12 and the doped active regions 16. A gate cavity 39 is formed from each volume from which a disposable gate structure (27, 29) is removed. Thus, the disposable gate structures (27, 29) are removed to expose the semiconductor surfaces of the semiconductor substrate 8 underneath each gate cavity 39.

Figure 6:
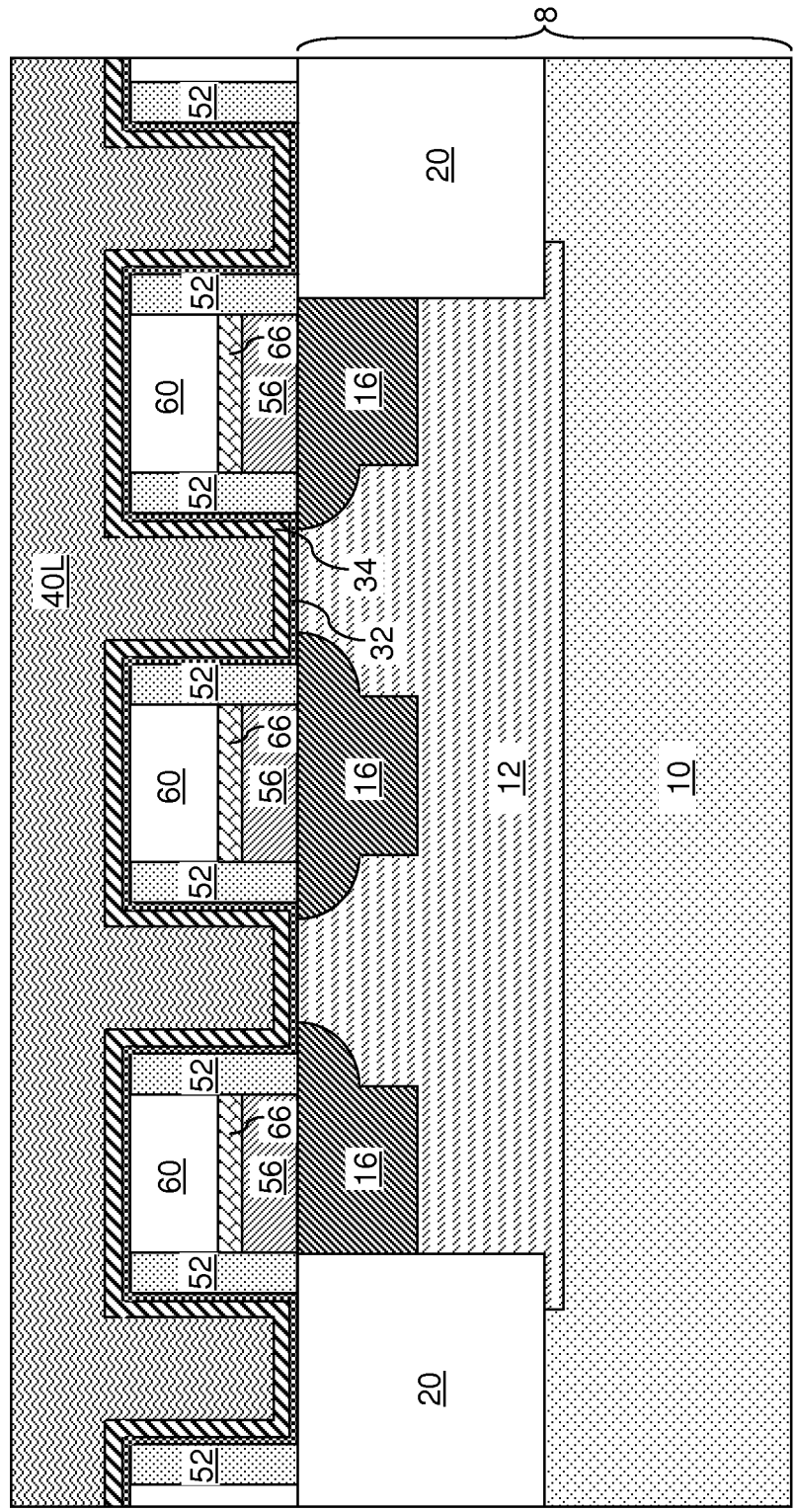
FIG. 6 is a vertical cross-sectional view of the first exemplary semiconductor structure after formation of a gate dielectric layer, a work function material layer, and an aluminum-containing material layer according to the first embodiment of the present disclosure.

Referring to FIG. 6, a gate dielectric layer 32, a work function material layer 34, and an aluminum-containing material layer 40L are sequentially formed. The gate dielectric layer 32, the work function material layer 34, and the aluminum-containing material layer 40L fill the gate cavities 39. Specifically, a gate dielectric layer 32 is deposited as a single contiguous layer on the bottom surface and inner sidewalls of all gate cavities 39 and all top surfaces of the planarization dielectric layer 60 and the dielectric spacers 52. The gate dielectric layer 32 can be a high dielectric constant (high-k) material layer having a dielectric constant greater than 3.9. The gate dielectric layer 32 can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 32, as measured at horizontal portions, can be from 0.9 nm to 6 nm, and preferably from 1.0 nm to 3 nm. The gate dielectric layer 32 can have an effective oxide thickness on the order of or less than 1 nm.

Subsequently, the work function material layer 34 is deposited as a contiguous layer directly on the gate dielectric layer 32. The work function material layer 34 is formed on a top surface of a horizontal portion of the gate dielectric layer 32 and on inner sidewalls of vertical portions of the gate dielectric layer 32. The work function material layer 34 can be a single contiguous layer or a plurality of layers including different materials. In one embodiment, the composition of the work function material layer 34 can locally vary to provide different adjustments to threshold voltage for different types of field effect transistor.

The work function material layer 32 includes a conductive material that can affect the work function of a field effect transistor to be subsequently formed. In one embodiment, the work function material layer 34 can include a silicon valence band edge metals such as Pt, Rh, Ir, Ru, Cu, Os, Be, Co, Pd, Te, Cr, Ni, TiN, and alloys thereof. A silicon valence band edge metal is a metal having a work function that is closer to the work function corresponding to the valence band edge of silicon, i.e., 5.10 eV, than to the work function corresponding to the conduction band edge of silicon, i.e., 4.00 eV. Thus, a silicon valence band edge metal has a work function that is greater than 4.55 eV. In another embodiment, the work function material layer 34L can include a silicon conduction band edge metals such as Hf, Ti, Ta, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys and nitrides/carbides thereof. A silicon conduction band edge metal is a metal having a work function that is closer to the work function corresponding to the conduction band edge of silicon than to the work function corresponding to the valence band edge of silicon. Thus, a silicon conduction band edge metal has a work function that is less than 4.55 eV.

The work function material layer 34 can be formed, for example, by physical vapor deposition, chemical vapor deposition, or atomic layer deposition (ALD). The thickness of the work function material layer 34 is typically set at a value from 1 nm to 30 nm, and more typically, from 2 nm to 10 nm, although lesser and greater thicknesses can also be employed.

The aluminum-containing material layer 40L is formed on inner sidewalls of the work function material layer 34 and on a top surface of a horizontal portion of the work function material layer 34. The aluminum-containing material layer 40L includes predominantly aluminum, i.e., more than 50% of atoms within the aluminum-containing material layer 40L are aluminum atoms. In one embodiment, the aluminum-containing material layer 40L can consist essentially of aluminum. In another embodiment, the aluminum-containing material layer 40L can include an aluminum alloy that include aluminum and at least one of cobalt, copper, silver, manganese, chromium, zinc, vanadium, titanium, tantalum, bismuth, gallium, lead, zirconium, silicon, iron, and magnesium. In yet another embodiment, the aluminum-containing material layer 40L can be a eutectic compound of aluminum having a lower melting point than pure aluminum. The aluminum-containing material layer 40 is deposited within a portion of each gate cavity.

The aluminum-containing material layer 40L can be formed, for example, by physical vapor deposition (PVD), vacuum evaporation, chemical vapor deposition (CVD), or by any other deposition method for deposition pure aluminum or an aluminum alloy. The thickness of the aluminum-containing material layer 40L can be selected to completely fill the gate cavities 39. Alternatively, the aluminum-containing material layer 40L can be deposited with such thickness that the material of the aluminum-containing material layer 40L completely fill the gate cavities 39 after a reflow process, in which the material of the aluminum-containing material layer 40L reflows to provide a horizontal top surface that extends over the entirety of the first exemplary structure.

Figure 7:
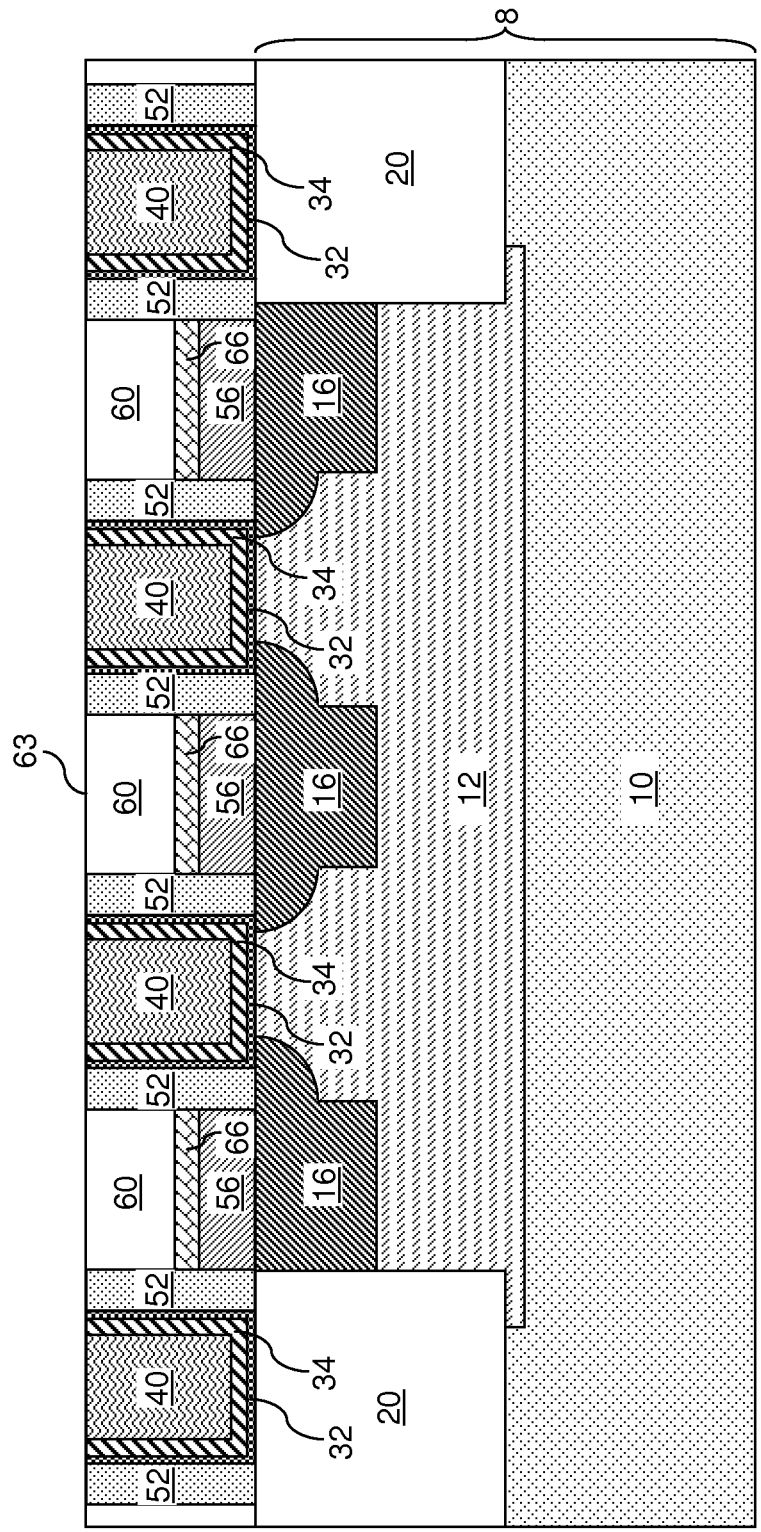
FIG. 7 is a vertical cross-sectional view of the first exemplary semiconductor structure after formation of replacement gate electrodes according to the first embodiment of the present disclosure.

Referring to FIG. 7, the aluminum-containing material layer 40L, the work function material layer 34, and the gate dielectric layer 32 are removed from above the planar dielectric surface 63 of the planarization dielectric layer 60 by a planarization process. The planarization process can employ the planarization dielectric layer 60 and/or the dielectric spacers 52 as at least one etch stop structures. Portions of the work function material layer 34 and the gate dielectric layer 32 above the planar dielectric surface 63 can be removed during the planarization. Remaining portions of the aluminum-containing material layer 40L after the planarization constitute aluminum-containing material portions 40.

A replacement gate structure is formed within each volume of gate cavity 39 that is present at the processing step of FIG. 5. Each replacement gate structure includes a gate dielectric layer 32, a work function material layer 34, and an aluminum-containing material portion 40. At least one semiconductor device employing at least one of the replacement gate structures (32, 34, 40) as an electrode is provided. The at least one semiconductor device can include a field effect transistor employing a portion of the doped well as a body region, two of the doped active regions 16 as a planar source region and a planar drain region, two of the raised active regions 56 as a raised source region and a raised drain region, two of the metal semiconductor alloy portions 66 as a source-side metal semiconductor alloy portion and a drain-side metal semiconductor alloy portion, one of the gate dielectric layers 32 as a gate dielectric, and a combination of a work function material layer 34 and an aluminum-containing material portion 40 in contact therewith as a replacement gate electrode, i.e., a gate electrode formed by replacement of a disposable structure.

Each of the gate dielectric layers 32 can be a U-shaped gate dielectric having a dielectric constant greater than 8.0. Each U-shaped gate dielectric includes a horizontal portion that is in contact with a top surface of the semiconductor substrate 8, and vertical portions that extend to the height of the planar dielectric surface 63. Each work function material layer 34 is in contact with a bottom surface and outer sidewalls of an aluminum-containing material portion 40. Each gate dielectric layer 32 is in contact with a bottom surface and outer sidewalls of the work function material layer 34. Each aluminum-containing material portion 40 is formed on inner sidewalls of a work function material layer 34 and on a top surface of a horizontal portion of the work function material layer 34. A dielectric spacer 52 laterally contacts, and surrounds, each gate dielectric layer 32.

Figure 8:
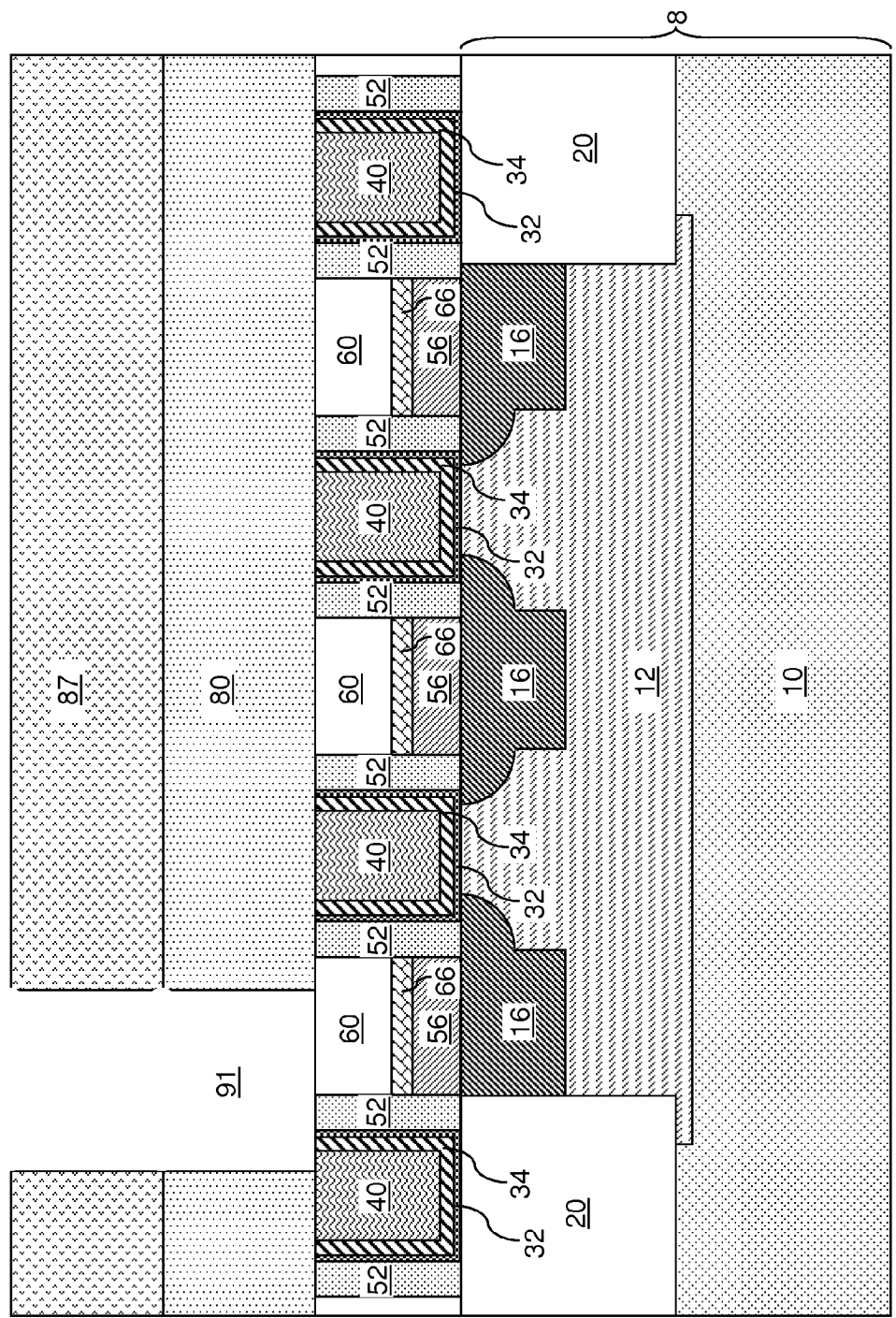
FIG. 8 is a vertical cross-sectional view of the first exemplary semiconductor structure after deposition of a contact level dielectric layer, application and patterning of a first photoresist layer, and formation of a first contact via cavity according to the first embodiment of the present disclosure.

Referring to FIG. 8, a contact level dielectric layer 80 is formed over the topmost surfaces of the aluminum-containing material portions 40. Specifically, the contact level dielectric layer 80 is deposited over the planarization dielectric layer 60, the dielectric spacers 52, and the replacement gate structures (32, 34, 40). In one embodiment, a topmost surface of each work function material layer 34, a topmost surface of each gate dielectric layer 32, and a topmost surface of each dielectric spacer 52 can be coplanar with the bottom surface of the contact level dielectric layer.

The contact level dielectric layer 80 includes a dielectric material that is different from the dielectric material of the planarization dielectric layer 60. If the planarization dielectric layer 60 includes at least one of undoped silicate glass (USG), doped silicate glass, organosilicate glass (OSG), undoped silicon oxynitride, and doped silicon oxynitride, the contact level dielectric layer 80 can include silicon nitride. Further, if the planarization dielectric layer 60 includes organosilicate glass (OSG), the contact level dielectric layer 80 can include at least one of silicon nitride, silicon oxide, and nitrogen-doped OSG. Yet further, if the planarization dielectric layer 60 includes a porous OSG, the contact level dielectric layer 80 can include at least one of silicon nitride, silicon oxide, nitrogen-doped OSG, and a non-porous OSG. In one embodiment, the planarization dielectric layer 60 can include at least one of undoped silicate glass (USG), doped silicate glass, organosilicate glass (OSG), undoped silicon oxynitride, and doped silicon oxynitride, and the contact level dielectric layer 80 can include silicon nitride. In one embodiment, the dielectric spacers 60 include silicon nitride, the contact level dielectric layer 80 includes silicon oxide or an OSG, and the contact level dielectric layer 80 includes silicon nitride.

The contact level dielectric layer 80 can be formed, for example, by chemical vapor deposition (CVD). The thickness of the contact level dielectric layer 80 can be from 30 nm to 1,000 nm, although lesser and greater thicknesses can also be employed.

A first photoresist layer 87 is applied over the top surface of the contact level dielectric layer 80, and is subsequently lithographically patterned to form a first via pattern including at least a first opening therein. The first via pattern in the first photoresist layer 87 is subsequently transferred through the contact level dielectric layer 80 by a first etch that employs the patterned first photoresist layer 87 as an etch mask. The first etch can be an anisotropic etch such as a reactive ion etch. In one embodiment, the chemistry of the first etch can be selected such that the first etch stops on the top surface of the planarization dielectric layer 60. The portion of the contact level dielectric layer 80 that underlies the first opening in the first photoresist layer 87 is etched through to form a first contact via cavity 91 within the contact level dielectric layer 80. The first contact via cavity 91 extends from the top surface of the contact level dielectric layer 80 to the bottom surface of the contact level dielectric layer 80.

The ideal position for the first opening in the first photoresist layer 87 can be a region overlying a portion of a metal semiconductor alloy portion 66, a portion of a raised active region 56, and/or a portion of a doped active region 16 and not overlying any replacement gate electrode (34, 40). In one embodiment, the ideal position for the first opening can be selected not to overlie any dielectric spacer 52. In another embodiment, the ideal position for the first opening may be selected to overlie a portion of a dielectric spacer 52 that is not in contact with a replacement gate structure (32, 34, 40). During manufacture of the first exemplary semiconductor device, overlay variations inherent in any lithographic alignment process can cause the actual location of the first opening to overlie a portion of a replacement gate structure (32, 34, 40). In this case, a surface of a replacement gate structure (32, 34, 40) can be physically exposed after the end of the first etch that forms the first contact via cavity 91 through the contact level dielectric layer 80.

Figure 9:
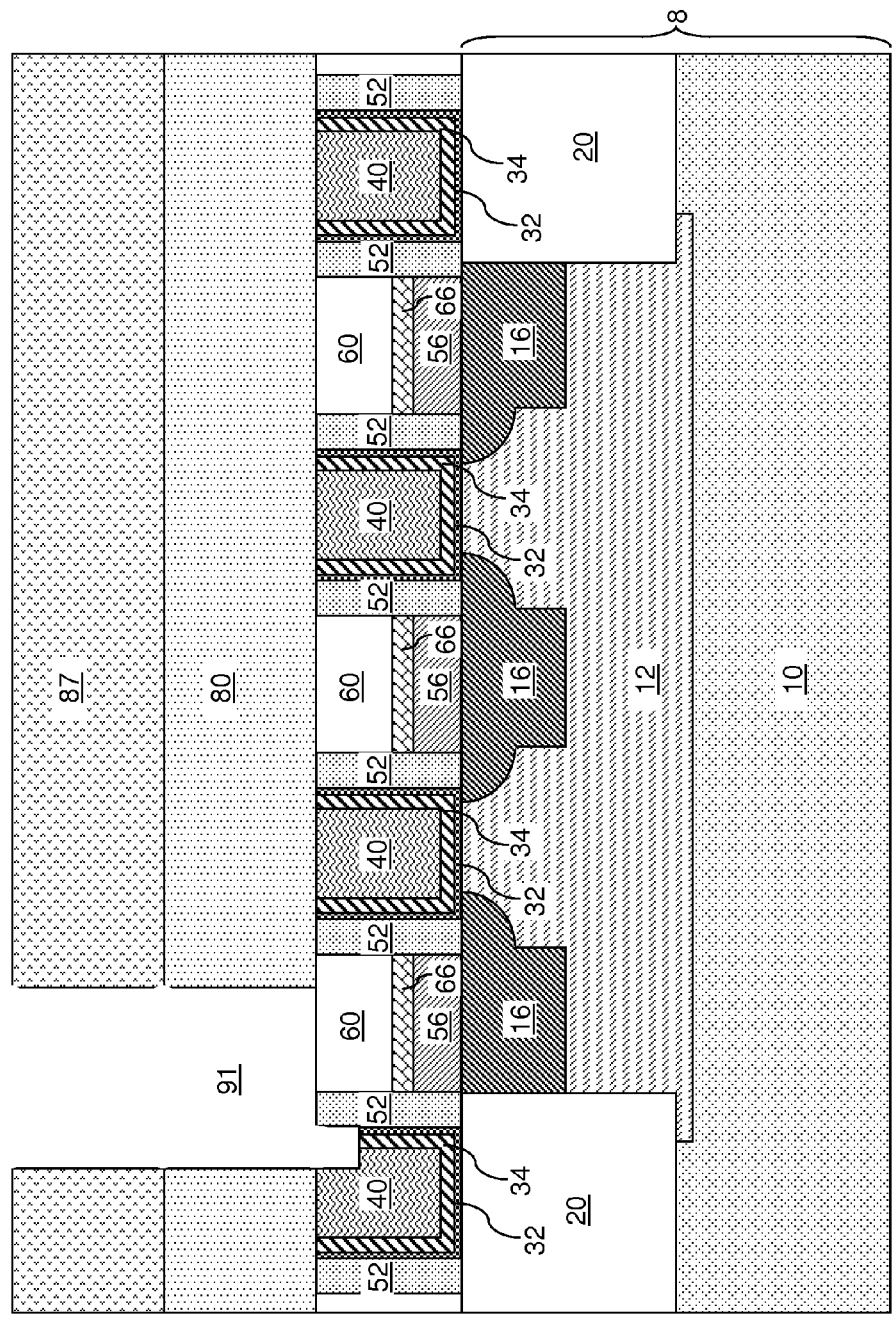
FIG. 9 is a vertical cross-sectional view of the first exemplary semiconductor structure after vertical recessing of a physically exposed surface of a replacement gate electrode according to the first embodiment of the present disclosure.

Referring to FIG. 9, the physically exposed surface of a replacement gate structure (32, 34, 40) is vertically recessed by a second etch that follows the first etch of the dielectric material of the contact level dielectric layer 80. The etch chemistry of the second etch is selected to remove the aluminum-containing material of the aluminum-containing material portion 40. In one embodiment, the second etch can be a dry etch that employs a combination of $BCl_3$ and $Cl_2$, which can etch metallic materials selective to silicon oxide and silicon nitride. In one embodiment, a chuck that holds the first exemplary semiconductor structure during the second etch can be heated to an elevated temperature, e.g., from 200 degrees Celsius to 400 degrees Celsius, to provide enhanced selectivity to silicon oxide and silicon nitride. In one embodiment, the temperature of the first exemplary semiconductor structure can be maintained below the reflow temperature of the aluminum-containing material of the aluminum-containing material portion 40 during the second etch.

The second etch vertically recesses physically exposed surfaces of the replacement gate structure (32, 34, 40) including physically exposed surfaces of the aluminum-containing material portion 40 and physically exposed surfaces of the work function metal layer 34 underneath the first contact via cavity 91. In one embodiment, the second etch can also vertically recess physically exposed surfaces of the gate dielectric layer 32 underneath the first contact via cavity 91. Thus, a sub-portion of the aluminum-containing material portion 40 underneath the first contact via cavity 91 as illustrated in FIG. 8 is removed during the second etch. In other words, the second etch vertically extends a bottom portion of the first contact via cavity 91 as illustrated in FIG. 8 within an areas of physically exposed surfaces of the replacement gate structure (32, 34, 40) by recessing the sub-portion of the aluminum-containing material portion 40, a portion of the gate dielectric layer 32, and a portion of the work function material layer 34. The first photoresist layer 87 is removed, for example, by ashing.

Figure 10:
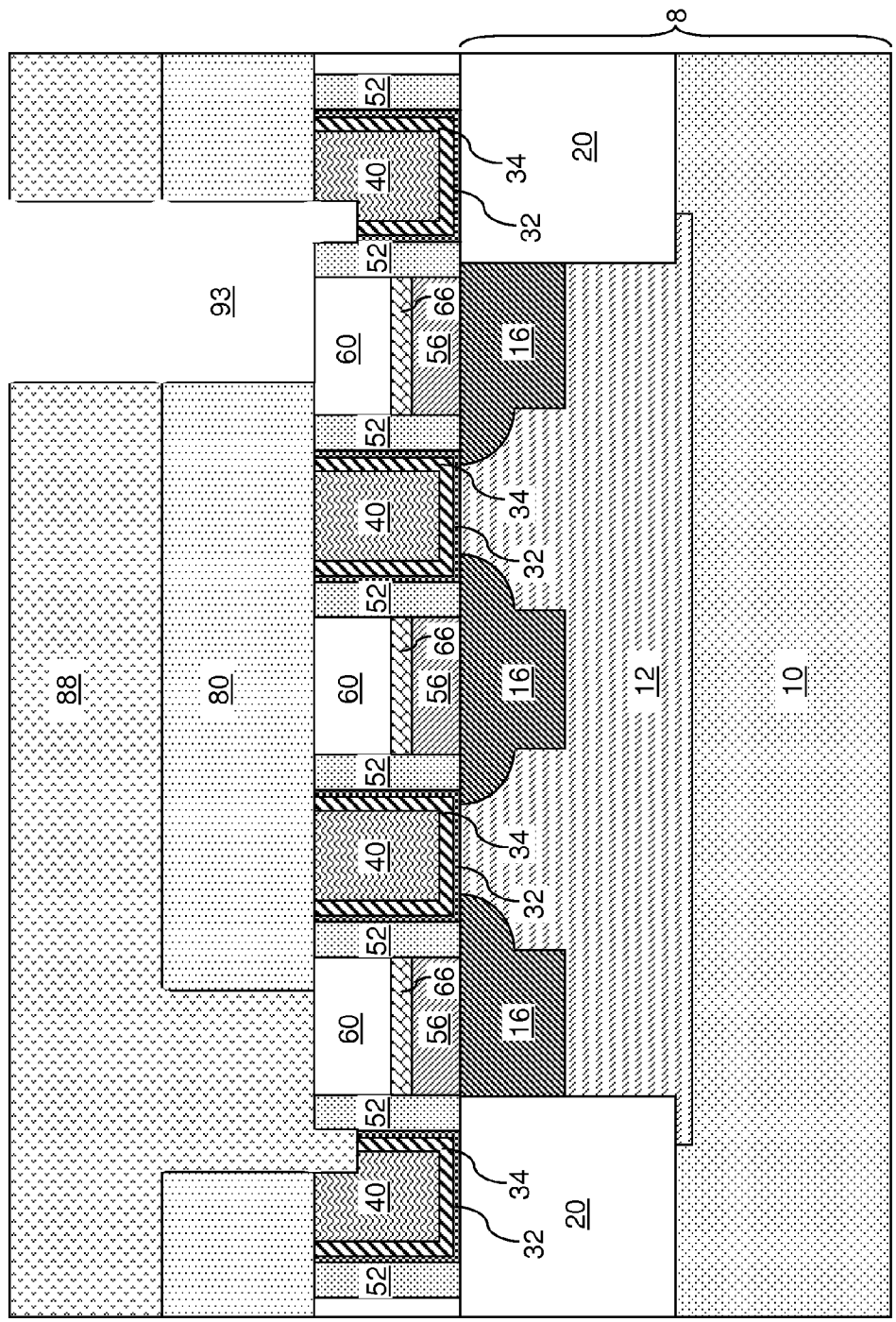
FIG. 10 is a vertical cross-sectional view of the first exemplary semiconductor structure after application and patterning of a second photoresist layer, formation of a second contact via cavity, and vertical recessing of a physically exposed surface of another replacement gate electrode according to the first embodiment of the present disclosure.

Referring to FIG. 10, optionally, a second photoresist layer 88 can be applied over the top surface of the contact level dielectric layer 80, and can be subsequently lithographically patterned to form a second via pattern including at least a second opening therein. The second via pattern in the second photoresist layer 88 is subsequently transferred through the contact level dielectric layer 80 by a third etch that employs the patterned second photoresist layer 88 as an etch mask. The third etch can be an anisotropic etch such as a reactive ion etch. In one embodiment, the chemistry of the third etch can be selected such that the third etch stops on the top surface of the planarization dielectric layer 60. In one embodiment, the chemistry of the third etch can be the same as the chemistry of the first etch. The portion of the contact level dielectric layer 80 that underlies the second opening in the second photoresist layer 88 is etched through to form a second contact via cavity 93 within the contact level dielectric layer 80. The second contact via cavity 93 extends from the top surface of the contact level dielectric layer 80 to the bottom surface of the contact level dielectric layer 80.

The ideal position for the second opening in the second photoresist layer 88 can be a region overlying a portion of a metal semiconductor alloy portion 66, a portion of a raised active region 56, and/or a portion of a doped active region 16 and not overlying any replacement gate electrode (34, 40). In one embodiment, the ideal position for the second opening can be selected not to overlie any dielectric spacer 52. In another embodiment, the ideal position for the second opening may be selected to overlie a portion of a dielectric spacer 52 that is not in contact with a replacement gate structure (32, 34, 40). During manufacture of the first exemplary semiconductor device, overlay variations inherent in any lithographic alignment process can cause the actual location of the second opening to overlie a portion of a replacement gate structure (32, 34, 40). In this case, a surface of a replacement gate structure (32, 34, 40) can be physically exposed after the end of the third etch that forms the second contact via cavity 93 through the contact level dielectric layer 80.

The physically exposed surface of a replacement gate structure (32, 34, 40) is vertically recessed by a fourth etch that follows the third etch of the dielectric material of the contact level dielectric layer 80. The etch chemistry of the fourth etch is selected to remove the aluminum-containing material of the aluminum-containing material portion 40. In one embodiment, the fourth etch can be a dry etch that employs a combination of $BCl_3$ and $Cl_2$. In one embodiment, a chuck that holds the first exemplary semiconductor structure during the fourth etch can be heated to an elevated temperature, e.g., from 200 degrees Celsius to 400 degrees Celsius, to provide enhanced selectivity to silicon oxide and silicon nitride. In one embodiment, the temperature of the first exemplary semiconductor structure can be maintained below the reflow temperature of the aluminum-containing material of the aluminum-containing material portion 40 during the fourth etch. In one embodiment, the etch chemistry of the fourth etch can be the same as the etch chemistry of the second etch.

The fourth etch vertically recesses physically exposed surfaces of the replacement gate structure (32, 34, 40) including physically exposed surfaces of the aluminum-containing material portion 40 and physically exposed surfaces of the work function metal layer 34 underneath the first contact via cavity 91. In one embodiment, the fourth etch can also vertically recess physically exposed surfaces of the gate dielectric layer 32 underneath the second contact via cavity 93. Thus, a sub-portion of the aluminum-containing material portion 40 underneath the second contact via cavity 93 is removed during the fourth etch. In other words, the fourth etch vertically extends a bottom portion of the second contact via cavity 93 within an areas of physically exposed surfaces of the replacement gate structure (32, 34, 40) by recessing the sub-portion of the aluminum-containing material portion 40, a portion of the gate dielectric layer 32, and a portion of the work function material layer 34.

Figure 11:
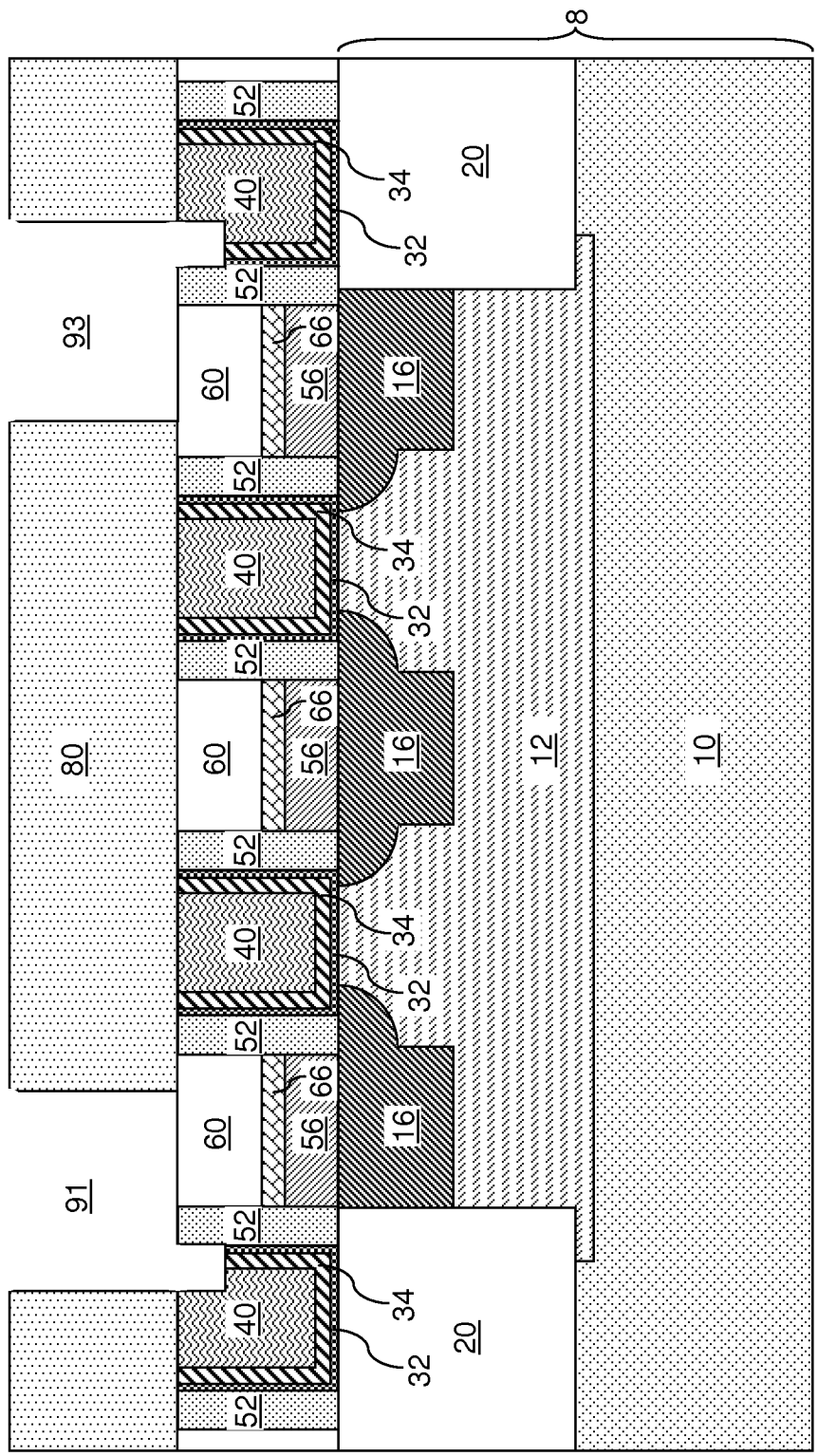
FIG. 11 is a vertical cross-sectional view of the first exemplary semiconductor structure after removal of the second photoresist layer according to the first embodiment of the present disclosure.

Referring to FIG. 11, the second photoresist layer 88 is removed, for example, by ashing.

Figure 12:
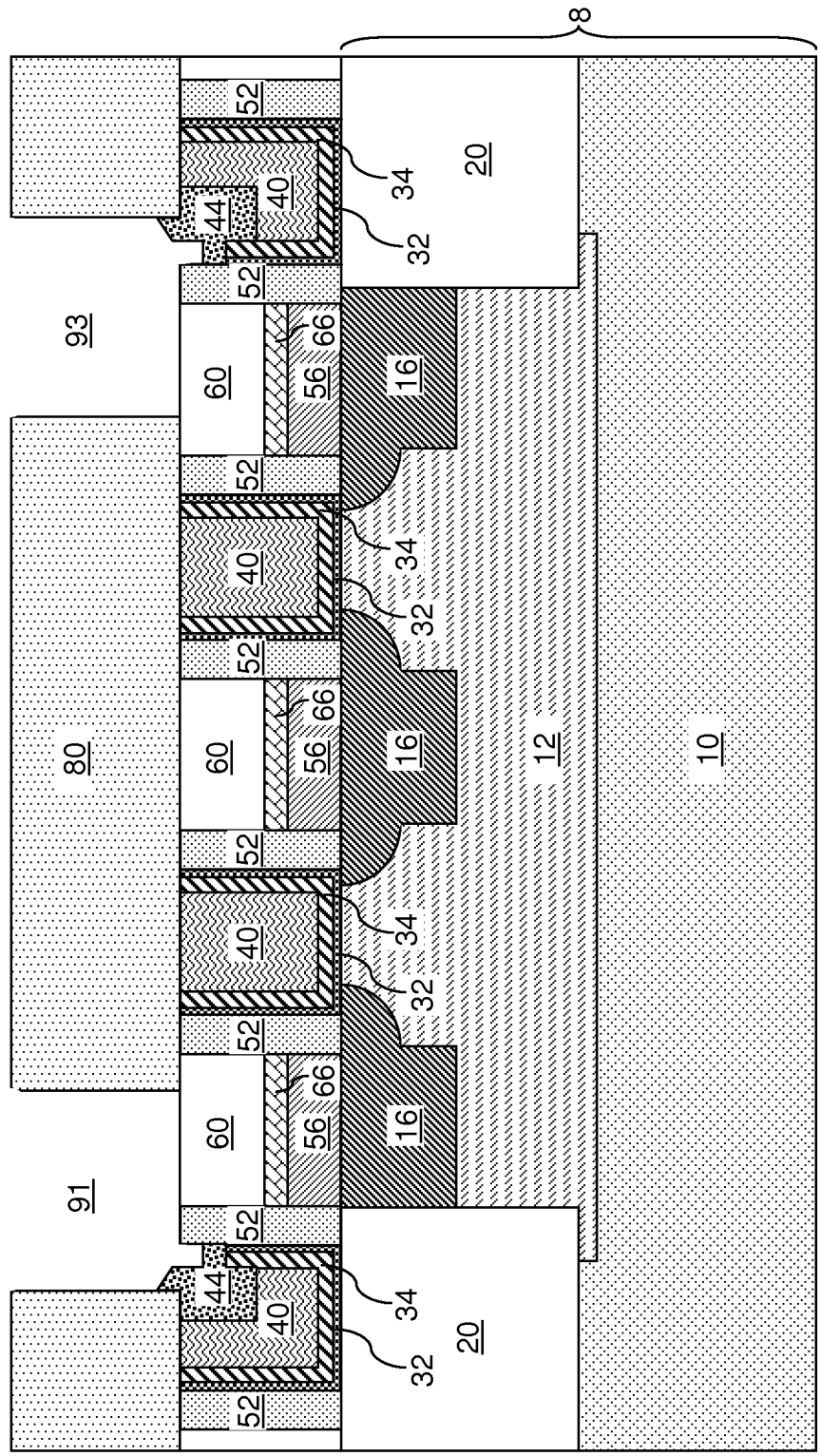
FIG. 12 is a vertical cross-sectional view of the first exemplary semiconductor structure after oxidation or nitridation of physically exposed surface portions of aluminum-containing material within the replacement gate electrodes according to the first embodiment of the present disclosure.

Referring to FIG. 12, surface portions of the aluminum-containing material portions 40 that are located in proximity to physically exposed surfaces of the aluminum-containing material portions 40 are converted into dielectric aluminum compound portions 44. The dielectric aluminum compound portions 44 include a dielectric aluminum compound, which can be aluminum oxide, aluminum nitride, a dielectric metallic oxide in which aluminum oxide is a predominant composition (i.e., aluminum oxide accounts for more than 50% of the material of dielectric metallic oxide, or a dielectric metallic nitride in which aluminum nitride is a predominant composition (i.e., aluminum nitride accounts for more than 50% of the material of the dielectric metallic nitride).

The conversion of the surface portions of the aluminum-containing material portions 40 into dielectric aluminum compound portions 44 can be effected by oxidation, nitridation, and/or anodization. The oxidation process can be a thermal oxidation process such as wet oxidation employing $H_2O$ or dry oxidation employing $O_2$, or can be a plasma oxidation process employing a plasma of oxygen and/or ozone. The nitridation process can be a thermal nitridation process employing $NH_3$, or can be a plasma nitridation process employing a plasma of $NH_3$ and/or $N_2$. The anodization process can be any an electrolytic passivation process that increase the thickness of a natural oxide layer on a surface of the aluminum-containing material portion 40 as known in the art. Volume expansion accompanies the conversion of the surface portions of the aluminum-containing material portions 40 into the dielectric aluminum compound portions 44 due to incorporation of oxygen atoms or nitrogen atoms. For example, in the case of oxidation of aluminum, an aluminum oxide portion converted from an aluminum portion by oxidation has a volume that is greater by 28% than the original volume of the aluminum portion.

Each dielectric aluminum compound portion 44 is in contact with an upper portion of an inner sidewall of a work function material layer 34, and can be in contact with a top surface of a the work function material layer 34 and a top surface of a gate dielectric layer 32. Further, the dielectric aluminum compound portion 44 can be in contact with a portion of an inner sidewall of a dielectric spacer 52. The planarization dielectric layer 60 can embed a lower portion of the dielectric aluminum compound portion 44. An uppermost portion of a dielectric aluminum compound portion 44 can protrude above the bottom surface of the contact level dielectric layer 80 as dielectric aluminum compound portion 44 goes through a volume expansion during the oxidation or nitridation process. Depending on the relative volumes of the converted portion of each aluminum-containing material portion 40 and the removed materials from a replacement gate structure (32, 34, 40) including that aluminum-containing material portion, the first and/or second contact via cavities (91, 93) may, or may not, protrude below the bottom surface of the contact level dielectric layer 80.

Figure 13:
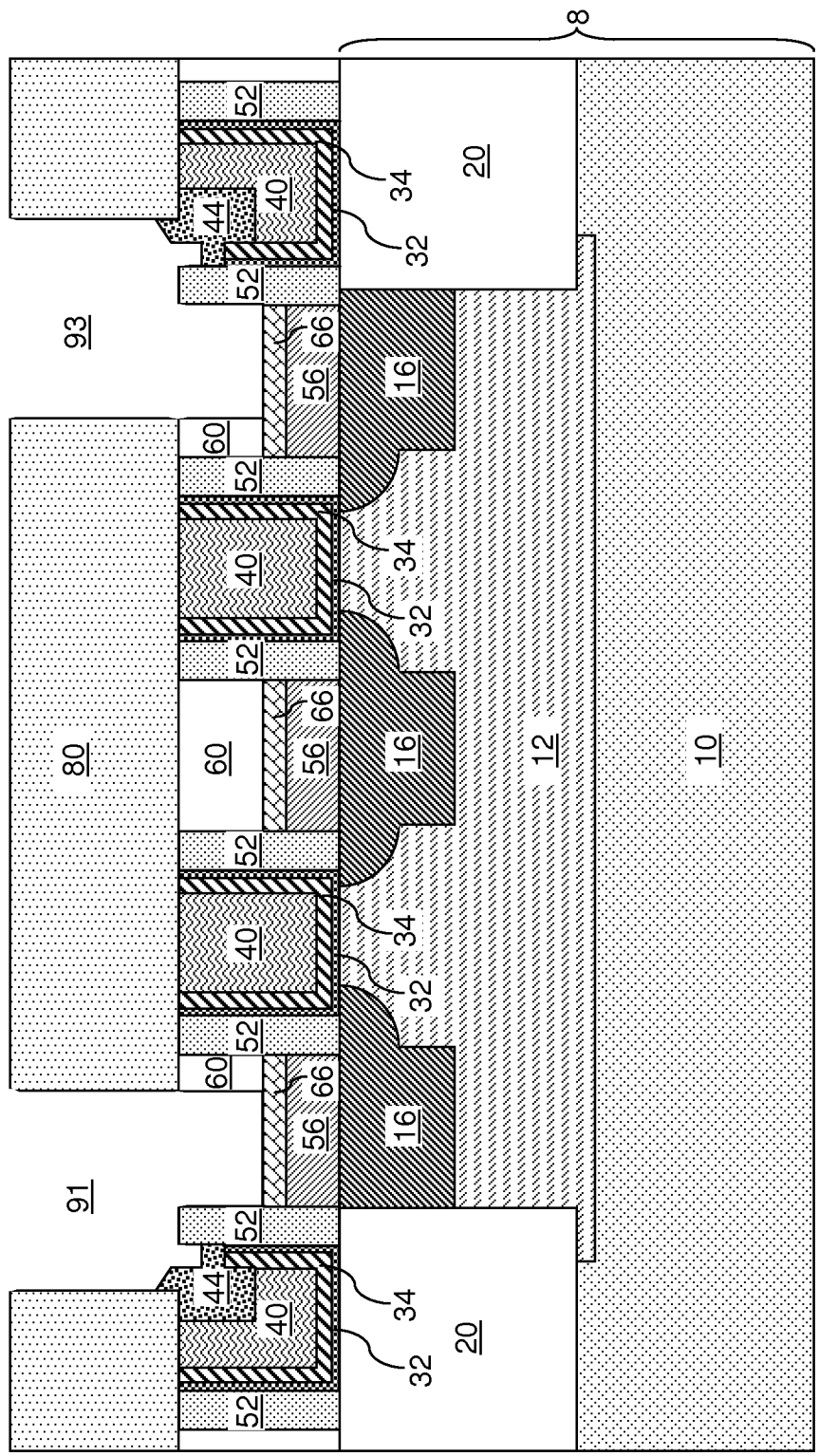
FIG. 13 is a vertical cross-sectional view of the first exemplary semiconductor structure after vertically extending the first and second contact via cavities according to the first embodiment of the present disclosure.

Referring to FIG. 13, the first and second contact via cavities (91, 93) are vertically extended by an etch that removes the dielectric material of the planarization dielectric layer 60 selective to the material of the dielectric aluminum compound portions 44. The etch can be an anisotropic etch such as a reactive ion etch.

In one embodiment, the etch chemistry of the etch that vertically extends the first and second contact via cavities (91, 92) through portions of the planarization dielectric layer 60 can be selective to the dielectric material of the dielectric spacers 52. For example, if the planarization dielectric layer 60 includes silicon oxide or OSG and the dielectric spacers 52 include silicon nitride, a fluorocarbon based reactive ion etch can be employed to vertically recess physically exposed horizontal surfaces of the planarization dielectric layer 60 without etching, or with minimal etching, of the dielectric aluminum compound portions 44 and the dielectric spacers 52. If the contact level dielectric layer 80 includes a dielectric material that is not etched by the chemistry of the etch that extends the first and second contact via cavities (91, 92), the etch can be selective to the contact level dielectric layer 80. For example, if the planarization dielectric layer 60 includes silicon oxide or OSG and the dielectric spacers 52 and the contact level dielectric layer 80 include silicon nitride, a fluorocarbon based reactive ion etch can be employed to vertically recess physically exposed horizontal surfaces of the planarization dielectric layer 60 selective to the dielectric aluminum compound portions 44, the dielectric spacers 52, and the contact level dielectric layer 80.

A surface of a conductive material portion of a semiconductor device can be physically exposed underneath each of the first and second contact via cavities (91, 93) as vertically extended through the planarization dielectric layer 60. In one embodiment, one of the semiconductor devices can be a field effect transistor and one of the aluminum-containing material portions 40 can be a portion of a gate conductor of the field effect transistor. The conductive material portion can be one of a source region of the field effect transistor, a drain region of the field effect transistor, a source-side metal semiconductor alloy portion of the field effect transistor, or a drain-side metal semiconductor alloy portion of the field effect transistor. While the present disclosure is described employing embodiments in which raised active regions 56 and metal semiconductor alloy portions 66 are formed, embodiments in which formation of raised active regions 56 and/or metal semiconductor alloy portions 66 are omitted are expressly contemplated herein.

Figure 14:
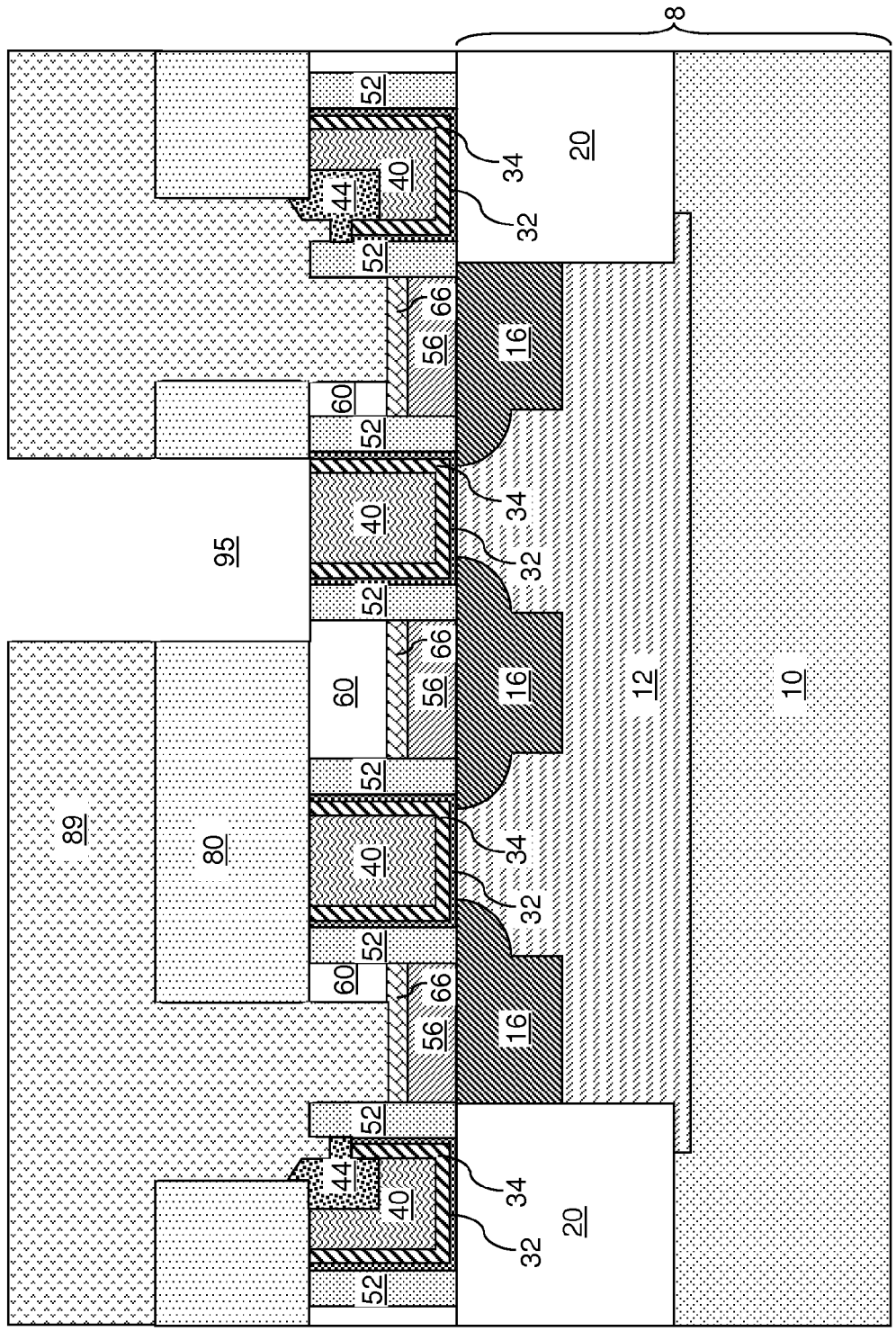
FIG. 14 is a vertical cross-sectional view of the first exemplary semiconductor structure after formation of at least one gate via cavity according to the first embodiment of the present disclosure.

Referring to FIG. 14, a third photoresist layer 89 is applied over the contact level dielectric layer 80, and is lithographically patterned to form at least one opening therein. The at least one opening can be located over the replacement gate structures (32, 34, 40). The pattern of the at least one opening in the third photoresist layer 89 is transferred through the contact level dielectric layer 80 to form at least one gate via cavity 95 therein. Each of the at least one gate cavity 95 extends from the top surface of the contact level dielectric layer 80 to the bottom surface of the contact level dielectric layer 80.

A top surface of a replacement gate structure (32, 34, 40) is physically exposed at the bottom of each of the at least one gate via cavity 95. Specifically, a top surface of an aluminum-containing material portion 40 is physically exposed at the bottom of each of the at least one gate via cavity 95. Optionally, surfaces of a gate dielectric layer 32, a work function material layer 34, a dielectric spacer 52, and a portion of the planarization dielectric layer 60 may be physically exposed at the bottom of one or more of the at least one gate via cavity 95 provided that the least one gate via cavity 95 does not overlap with any of the first and second contact via cavities (91, 93, See FIG. 12) that are filled with the third photoresist layer 89. In one embodiment, the location(s) of the at least one opening in the third photoresist layer 89 is selected such that the at least one gate via cavity 95 does not overlie any of the dielectric aluminum compound portions 44. The third photoresist layer 89 is subsequently removed, for example, by ashing.

Figure 15:
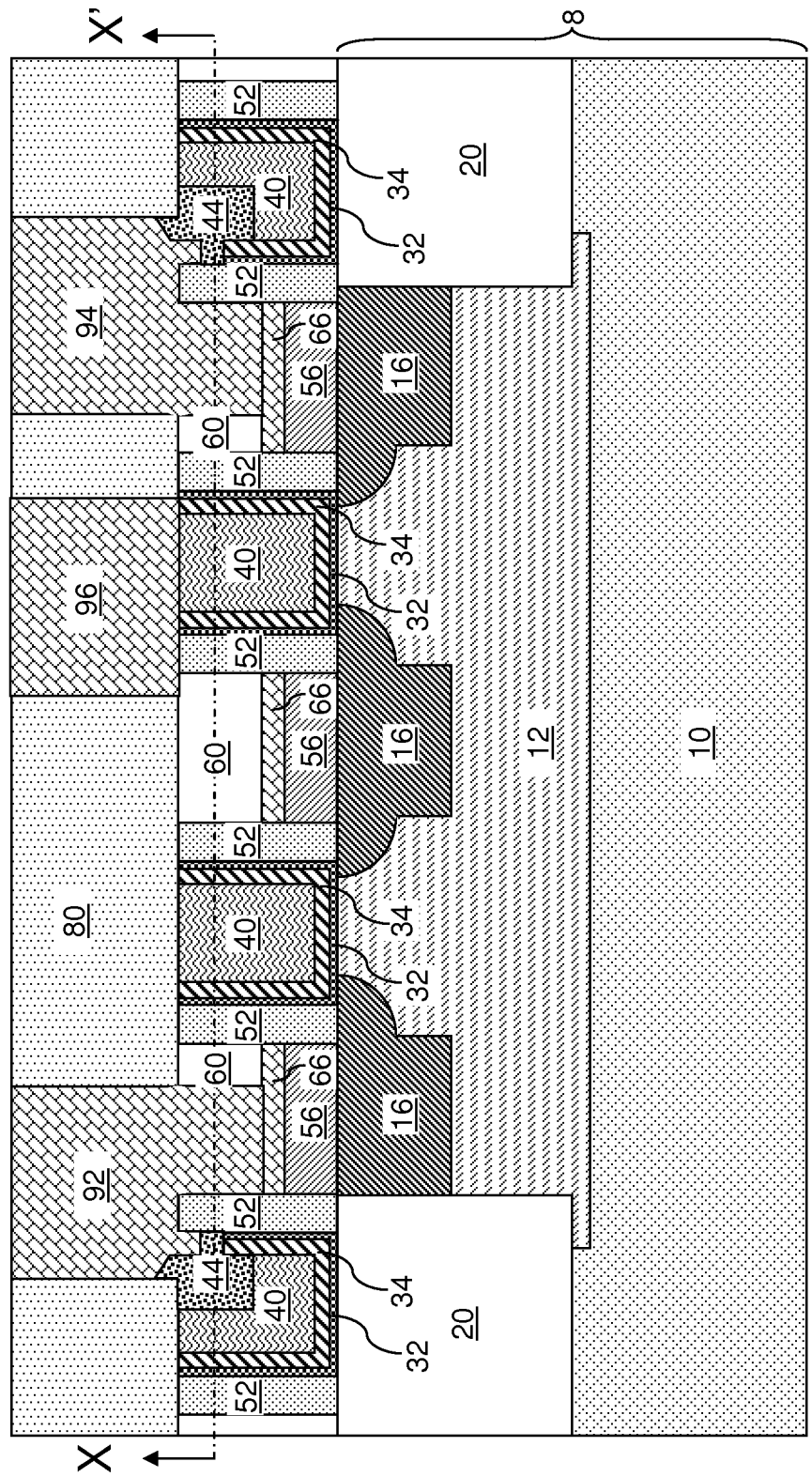
FIG. 15 is a vertical cross-sectional view of the first exemplary semiconductor structure along a vertical plane Z-Z' of FIG. 16 after formation of active region contact via structures and a gate contact structure according to the first embodiment of the present disclosure.
Figure 16:
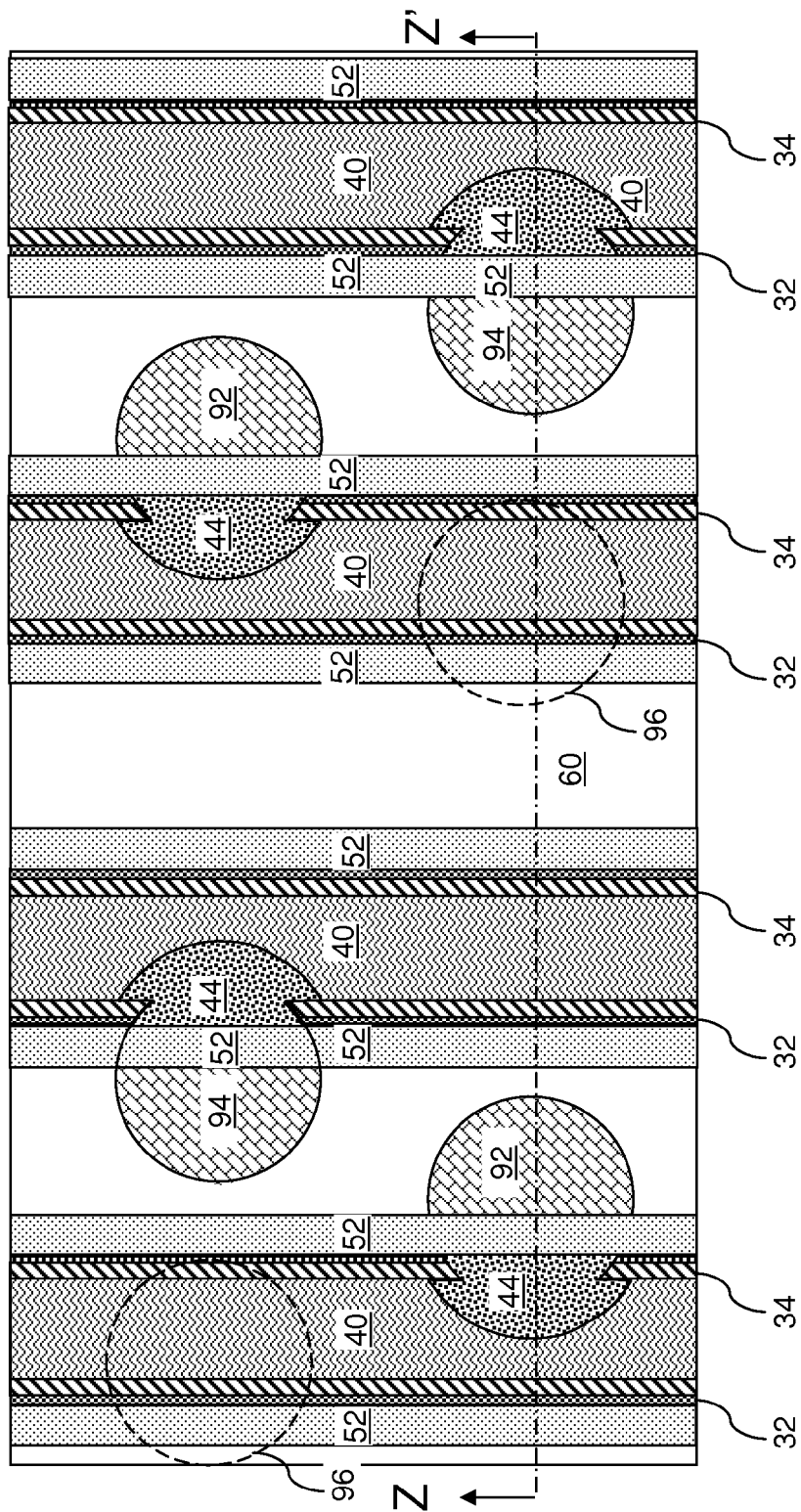
FIG. 16 is a horizontal cross-sectional view of the first exemplary semiconductor structure along a horizontal plane X-X' of FIG. 15.

Referring to FIGS. 15 and 16, at least one conductive material is deposited into the first and second contact via cavities (91, 93) and the at least one gate via cavity 95, for example, by physical vapor deposition (PVD), chemical vapor deposition (CVD), electroplating, electroless plating, or a combination thereof. The at least one conductive material can include, for example, Al, W, Ta, Ti, Cu, WN, TaN, TiN, WC, TiC, TaC, or combinations thereof. The at least one conductive material is subsequently removed from the top surface of the contact level dielectric layer 80, for example, by chemical mechanical planarization and/or a recess etch.

A remaining portion of the at least one conductive material within the first contact via cavity 91 constitutes a contact via structure, which is herein referred to as a first active region contact via structure 92. The first active region contact via structure 92 contacts a conductive material portion that is a first active region (such as a source region or a drain region), or is conductively connected to an active region (as in the case of a metal semiconductor alloy portion 66 that is conductively connected to a raised active region 66 or a doped active region 16). The first active region contact via structure 92 is electrically isolated from the most proximate aluminum-oxide containing portions 40 by a dielectric aluminum compound portion 44. The first active region contact via structure 92 includes a lower contact via structure portion located below the bottom surface of the contact level dielectric layer 80. A dielectric aluminum compound portion 44 can be laterally spaced from the lower contact via structure portion by a portion of a dielectric spacer 52. The dielectric aluminum compound portion 44 is in contact with an aluminum-containing material portion 40 and the first active region contact via structure 92.

A remaining portion of the at least one conductive material within the second contact via cavity 93 constitutes another contact via structure, which is herein referred to as a second active region contact via structure 94. The second active region contact via structure 94 contacts another conductive material portion that is a second active region (such as a source region or a drain region), or is conductively connected to another active region (as in the case of a metal semiconductor alloy portion 66 that is conductively connected to a raised active region 66 or a doped active region 16). The second active region contact via structure 94 is electrically isolated from the most proximate aluminum-oxide containing portions 40 by a dielectric aluminum compound portion 44. The second active region contact via structure 94 includes a lower contact via structure portion located below the bottom surface of the contact level dielectric layer 80. A dielectric aluminum compound portion 44 can be laterally spaced from the lower contact via structure portion by a portion of a dielectric spacer 52. The dielectric aluminum compound portion 44 is in contact with an aluminum-containing material portion 40 and the second active region contact via structure 94.

A remaining portion of the at least one conductive material within each of the at least one gate via cavity 95 constitutes a contact via structure, which is herein referred to as a gate contact via structure 96. Each gate contact structure 96 extends through the contact level dielectric layer 80 and contacts a top surface of one of the aluminum-containing material portions 40. Each gate contact structure 96 can provide an electrical contact to the replacement gate electrode (34, 40) including the aluminum-containing material portion 40. In one embodiment, the gate contact structures 95 do not contact any dielectric aluminum compound portion 44.

Dielectric aluminum compound portions 44 are formed within any region in which the physical areas of the first and second active region contact via structures (92, 94) and the areas conductive structures such as the replacement gate electrodes (34, 40) overlap. Thus, the first and second active region contact via structures (92, 94) do not require any border structure to laterally space the first and second active region contact via structures (92, 94) from conductive structures such as the replacement gate electrodes (34, 40). As such, the first and second active region contact via structures (92, 94) are "borderless" contact structures.

Figure 17:
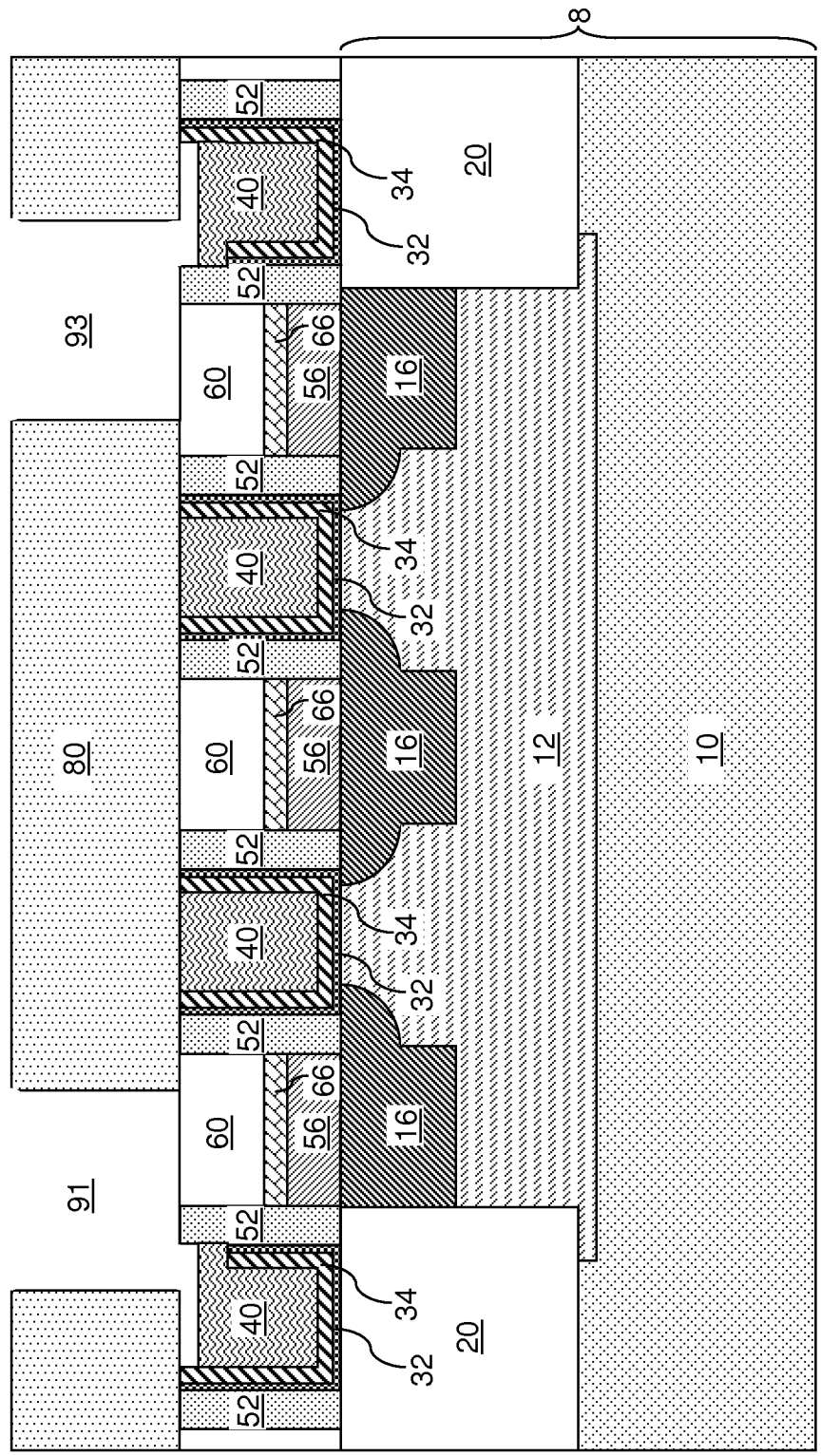
FIG. 17 is a vertical cross-sectional view of a second exemplary semiconductor structure after reflow of aluminum-containing material portions in replacement gate structures according to a second embodiment of the present disclosure.

Referring to FIG. 17, a second exemplary semiconductor structure according to a second embodiment of the present disclosure is derived from the first exemplary structure of FIG. 11 by reflowing the aluminum-containing material portions 40 in the replacement gate structures (32, 34, 40). As discussed above, the sub-portions of the aluminum-containing material portion 40 that are located underneath the first and second contact via cavities (91, 93) are etched in the processing steps of FIGS. 9-11. Remaining portions of the aluminum-containing material portion 40 are subsequently reflowed by an anneal at an elevated temperature, which can be at or above the reflow temperature of the material of the aluminum-containing material portion 40. If the aluminum-containing material portion 40 consists of aluminum, the reflow of the aluminum-containing material portion 40 can be performed at a temperature greater than 400 degrees Celsius. In one embodiment, the temperature of the reflow can be below a temperature that causes changes in the materials of the gate stacks. Each aluminum-containing material portion 40 after the reflow process has a planar top surface that is located above a recessed top surface of a gate dielectric layer 32 and a recessed top surface of a work function material layer 34. Further, the planar top surface of each aluminum-containing material portion 40 extends from an inner sidewall of a vertical portion of a work function material layer 34 at one end to an inner sidewall of a dielectric spacer 52 at another end.

Figure 18:
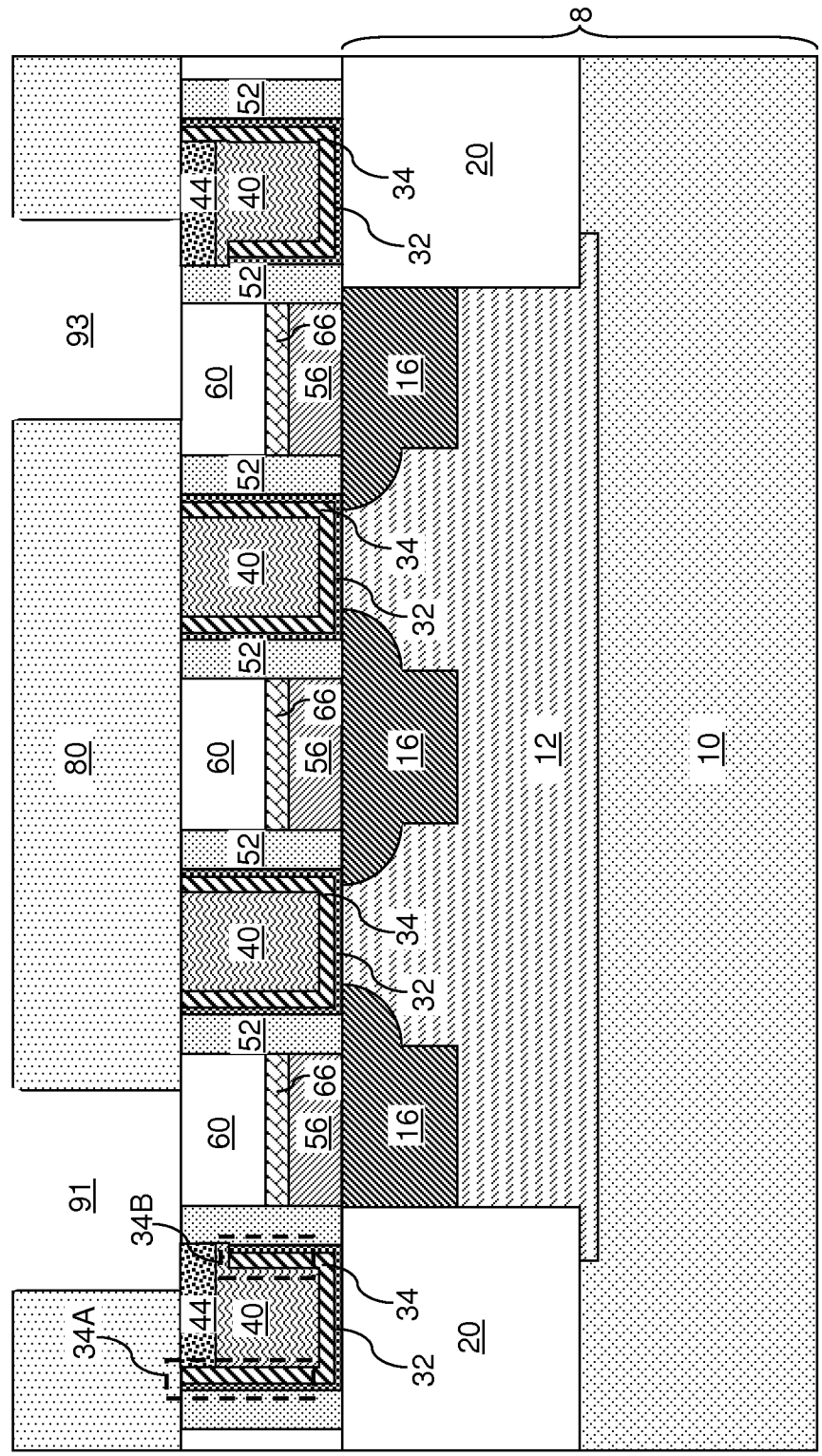
FIG. 18 is a vertical cross-sectional view of the second exemplary semiconductor structure after oxidation or nitridation of physically exposed surface portions of aluminum-containing material within the replacement gate electrodes according to the second embodiment of the present disclosure.

Referring to FIG. 18, the processing step of FIG. 13 is performed. In other words, oxidation or nitridation is performed on physically exposed surface portions of aluminum-containing material within the replacement gate electrodes (32, 34, 40). Upon formation of dielectric aluminum compound portions 44, a topmost surface of each aluminum-containing material portion 44 is vertically spaced from the bottom surface of the contact level dielectric layer 80 by the dielectric aluminum compound portion 44. A dielectric spacer 52 laterally contacts, and surrounds, each gate dielectric layer 32. A dielectric aluminum compound portion 44 can laterally contact a portion of an inner sidewall of a work function material layer 34 on one side, and a portion of an inner sidewall of a dielectric spacer 52 on another side.

A work function material layer 34 includes a first vertical work function material portion 34A in contact with a bottom surface of the contact level dielectric layer 80 and located on one side, and a second vertical work function material portion 34B vertically spaced from the bottom surface of the contact level dielectric layer 80 and located on another side. In one embodiment, the dielectric aluminum compound portion 44 can laterally contact the first vertical work function material portion 34A and does not contact the second vertical work function material portion 34B.

In one embodiment, a dielectric aluminum compound portion 44 can be in contact with an upper portion of an inner sidewall of a work function material layer 34, e.g., the first vertical work function material portion 34A. Further, the dielectric aluminum compound portion 44 can be in contact with a portion of an inner sidewall of the dielectric spacer 52.

Figure 19:
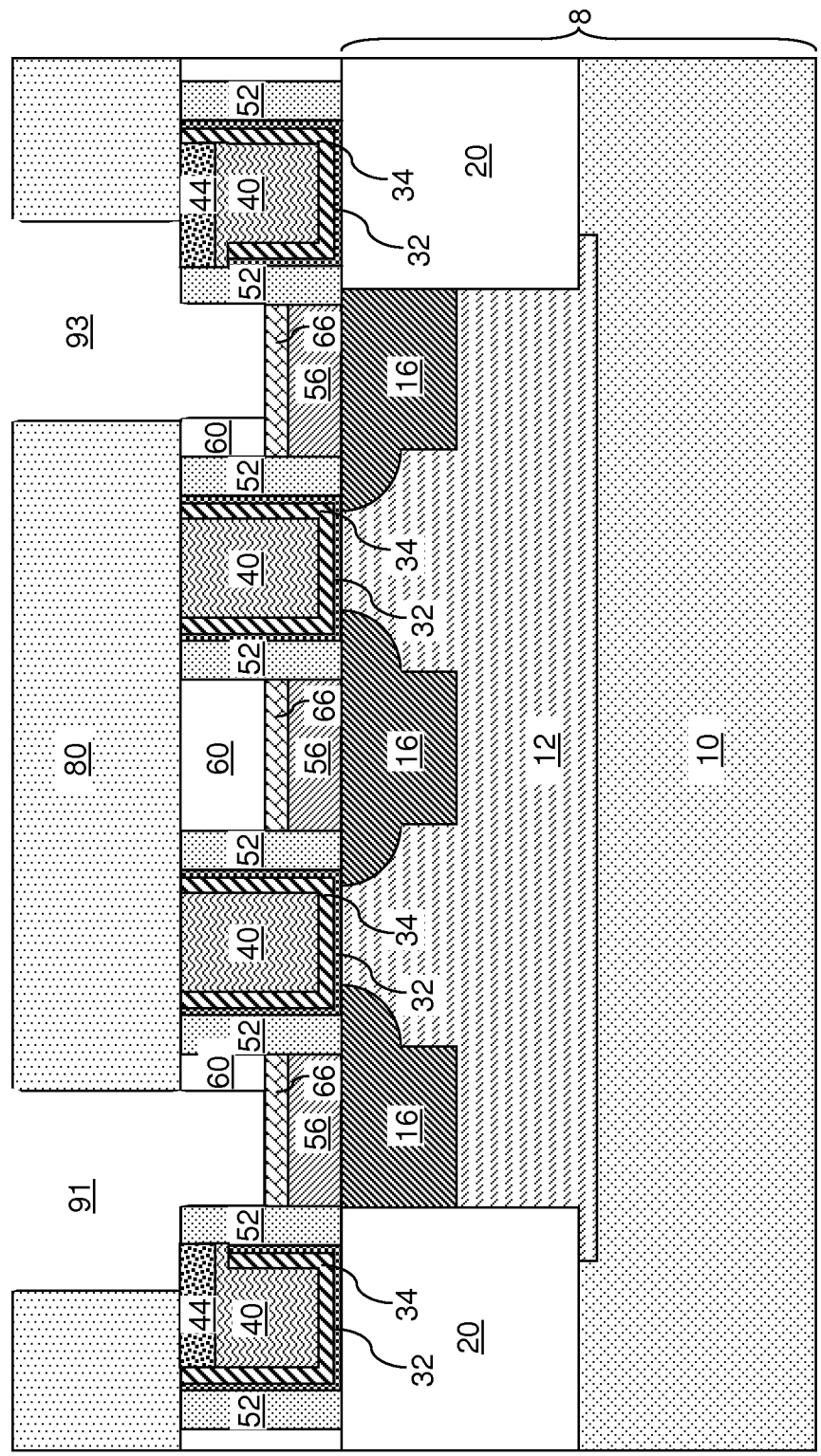
FIG. 19 is a vertical cross-sectional view of the second exemplary semiconductor structure after vertically extending the first and second contact via cavities according to the second embodiment of the present disclosure.

Referring to FIG. 19, the first and second contact via cavities (91, 93) can be vertically extended employing the same processing steps as the processing steps of FIG. 13.

Figure 20:
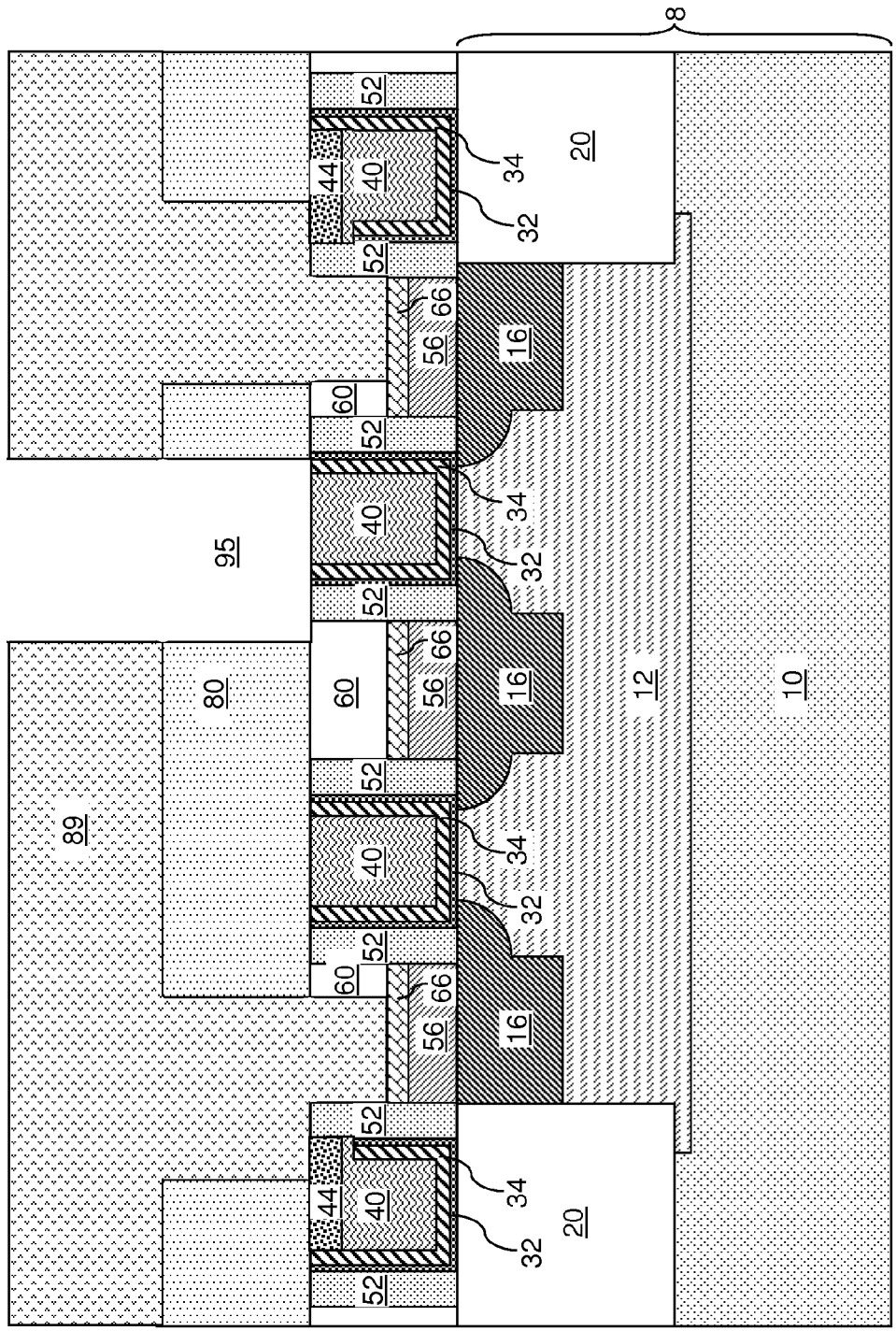
FIG. 20 is a vertical cross-sectional view of the second exemplary semiconductor structure after formation of at least one gate via cavity according to the second embodiment of the present disclosure.

Referring to FIG. 20, at least one gate via cavity 95 can be formed in the contact level dielectric layer 80 employing the same processing steps as the processing steps of FIG. 14.

Figure 21:
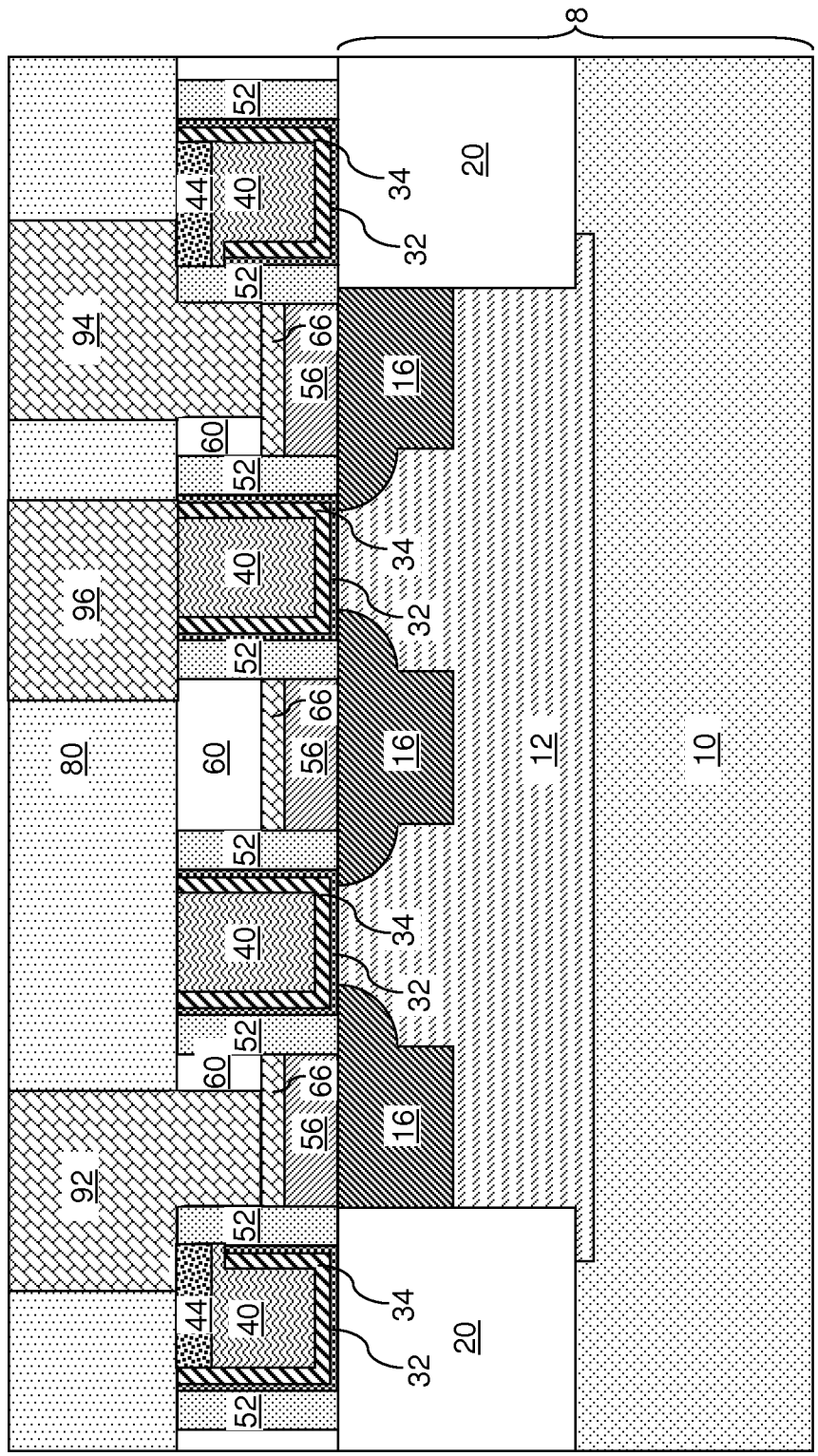
FIG. 21 is a vertical cross-sectional view of the second exemplary semiconductor structure along a vertical plane Z-Z' of FIG. 16 after formation of active region contact via structures and a gate contact structure according to the second embodiment of the present disclosure.

Referring to FIG. 21, first and second active region contact via structures (92, 94) and at least one gate contact structure 96 are formed employing the same processing steps as the processing steps of FIGS. 15 and 16. As in the first embodiment, dielectric aluminum compound portions 44 are present within any region in which the physical areas of the first and second active region contact via structures (92, 94) and the areas conductive structures such as the replacement gate electrodes (34, 40) overlap. Thus, the first and second active region contact via structures (92, 94) of the second embodiment are "borderless" contact structures as in the first embodiment.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
   a semiconductor device located on a semiconductor substrate, said semiconductor device including an aluminum-containing material portion;
   a contact level dielectric layer located over a topmost surface of said aluminum-containing material portion;
   a contact via structure extending through said contact level dielectric layer and in contact with a conductive material portion of said semiconductor device;
   a dielectric aluminum compound portion in contact with said aluminum-containing material portion and said contact via structure;
   a work function material layer in contact with a bottom surface and outer sidewalls of said aluminum-containing material portion; and
   a gate dielectric layer in contact with a bottom surface and outer sidewalls of said work function material layer, wherein said dielectric aluminum compound portion is in contact with an upper portion of an inner sidewall of said work function material layer.

2. The semiconductor structure of claim 1, further comprising a planarization dielectric layer located over a top surface of said semiconductor substrate and under said contact level dielectric layer and embedding said dielectric aluminum compound portion.

3. The semiconductor structure of claim 1, further comprising a dielectric spacer laterally contacting, and surrounding, said gate dielectric layer, wherein said dielectric aluminum compound portion is in contact with a portion of an inner sidewall of said dielectric spacer.

4. The semiconductor structure of claim 1, wherein said semiconductor device is a field effect transistor and said aluminum-containing material portion is a portion of a gate conductor, and said conductive material portion is a source region of said field effect transistor, a drain region of said field effect transistor, a source-side metal semiconductor alloy portion of said field effect transistor, or a drain-side metal semiconductor alloy portion of said field effect transistor.

5. The semiconductor structure of claim 1, further comprising another contact via structure in contact with a top surface of said aluminum-containing material portion and is not in contact with any dielectric aluminum compound material.

6. The semiconductor structure of claim 1, further comprising a dielectric spacer laterally contacting, and surrounding, said gate dielectric layer.

7. The semiconductor structure of claim 6, wherein said contact via structure comprises a lower contact via structure portion located below a bottom surface of said contact level dielectric layer, and said dielectric aluminum compound portion is laterally spaced from said lower contact via structure portion by a portion of said dielectric spacer.

8. The semiconductor structure of claim 6, wherein a topmost surface of said work function material layer, a topmost surface of said gate dielectric layer, and a topmost surface of said dielectric spacer is coplanar with a bottom surface of said contact level dielectric layer.

9. A semiconductor structure comprising:
   a semiconductor device located on a semiconductor substrate, said semiconductor device including an aluminum-containing material portion;
   a contact level dielectric layer located over a topmost surface of said aluminum-containing material portion;
   a contact via structure extending through said contact level dielectric layer and in contact with a conductive material portion of said semiconductor device
   a dielectric aluminum compound portion in contact with said aluminum-containing material portion and said contact via structure;
   a work function material layer in contact with a bottom surface and outer sidewalls of said aluminum-containing material portion;
   a gate dielectric layer in contact with a bottom surface and outer sidewalls of said work function material layer; and
   a dielectric spacer laterally contacting, and surrounding, said gate dielectric layer, wherein said dielectric aluminum compound portion laterally contacts a portion of an inner sidewall of said work function material layer and a portion of an inner sidewall of said dielectric spacer, wherein a topmost surface of said aluminum-containing material portion is spaced from a bottom surface of said contact level dielectric layer by said dielectric aluminum compound portion.

10. The semiconductor structure of claim 9, wherein said work function material layer comprises a first vertical work function material portion in contact with a bottom surface of said contact level dielectric layer located on one side and a second vertical work function material portion vertically spaced from said bottom surface of said contact level dielectric layer located on another side, wherein said dielectric aluminum compound portion laterally contacts said first vertical work function material portion and does not contact said second vertical work function material portion.

* * * * *